US008515155B2

(12) United States Patent　　　　　　　　　　　　(10) Patent No.: US 8,515,155 B2
Toyoda et al.　　　　　　　　　　　　　　　　　　　(45) Date of Patent: Aug. 20, 2013

(54) PATTERN GENERATING APPARATUS AND PATTERN SHAPE EVALUATING APPARATUS

(71) Applicant: Hitachi High-Technologies Corporation, Tokyo (JP)

(72) Inventors: Yasutaka Toyoda, Hitachi (JP); Hideo Sakai, Musashino (JP); Ryoichi Matsuoka, Yotsukaido (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/750,761

(22) Filed: Jan. 25, 2013

(65) Prior Publication Data

US 2013/0136335 A1　　May 30, 2013

Related U.S. Application Data

(63) Continuation of application No. 12/366,196, filed on Feb. 5, 2009, now Pat. No. 8,077,962.

(30) Foreign Application Priority Data

Feb. 13, 2008　(JP) .................................. 2008-031314

(51) Int. Cl.
　　　*G06K 9/00*　　　　(2006.01)
(52) U.S. Cl.
　　　CPC ....................... *G06K 9/00* (2013.01)
　　　USPC ...................................................... 382/145
(58) Field of Classification Search
　　　CPC .......................................................... G06K 9/00
　　　USPC ................................................ 382/145–148
　　　See application file for complete search history.

(56) References Cited

U.S. PATENT DOCUMENTS 5,475,766 A　　12/1995　Tsuchiya et al.
6,222,935 B1　　4/2001　Okamoto
(Continued)

FOREIGN PATENT DOCUMENTS

JP　　11-73513 A　　7/1989
JP　　07-260699 A　　10/1995
(Continued)

OTHER PUBLICATIONS

Japanese Office Action, and English translation thereof, issued in Japanese Patent Application No. 2008-031314 dated Aug. 21, 2012.

(Continued)

*Primary Examiner* — Michael P Stafira
(74) *Attorney, Agent, or Firm* — McDermott Will & Emery LLP

(57) ABSTRACT

Although there has been a method for evaluating pattern shapes of electronic devices by using, as a reference pattern, design data or a non-defective pattern, the conventional method has a problem that the pattern shape cannot be evaluated with high accuracy because of the difficulty in defining an exact shape suitable for the manufacturing conditions of the electronic devices. The present invention provides a shape evaluation method for circuit patterns of electronic devices, the method including a means for generating contour distribution data of at least two circuit patterns from contour data sets on the circuit patterns; a means for generating a reference pattern used for the pattern shape evaluation, from the contour distribution data; and a means for evaluating the pattern shape by comparing each evaluation target pattern with the reference pattern.

16 Claims, 24 Drawing Sheets

(56) References Cited

U.S. PATENT DOCUMENTS

| | | |
|---|---|---|
| 6,868,175 B1 | 3/2005 | Yamamoto et al. |
| 7,106,897 B1 * | 9/2006 | McIntyre et al. ............. 382/145 |
| 7,559,047 B2 * | 7/2009 | Miyamoto et al. ............. 716/50 |
| 7,796,801 B2 * | 9/2010 | Kitamura et al. ............. 382/141 |
| 7,848,563 B2 | 12/2010 | Sakai et al. |
| 7,923,703 B2 | 4/2011 | Morokuma et al. |
| 2006/0045326 A1 | 3/2006 | Toyoda et al. |
| 2006/0193508 A1 | 8/2006 | Sutani et al. |
| 2006/0245636 A1 | 11/2006 | Kitamura et al. |
| 2007/0023653 A1 | 2/2007 | Toyoda et al. |
| 2007/0098248 A1 | 5/2007 | Toyoda et al. |
| 2008/0069453 A1 | 3/2008 | Abe et al. |
| 2008/0175469 A1 | 7/2008 | Toyoda et al. |
| 2009/0039261 A1 | 2/2009 | Toyoda et al. |
| 2012/0092483 A1 * | 4/2012 | Sugiyama et al. ............. 348/80 |

FOREIGN PATENT DOCUMENTS

| | | |
|---|---|---|
| JP | 09-203621 A | 8/1997 |
| JP | 10-312461 A | 11/1998 |
| JP | 11-288879 A | 10/1999 |
| JP | 2001-338304 A | 12/2001 |
| JP | 2002-006479 A | 1/2002 |
| JP | 2006-220644 A | 8/2006 |
| WO | WO-2007/094439 A1 | 8/2007 |

OTHER PUBLICATIONS

Entire Prosecution of U.S. Appl. No. 12/366,196 to Yasutaka Toyoda et al., filed Feb. 5, 2009, entitled "Pattern Generating Apparatus and Pattern Shape Evaluating Apparatus."

Entire Prosecution of U.S. Appl. No. 13/294,828 to Yasutaka Toyoda et al., filed Nov. 11, 2011, entitled ., "Pattern Generating Apparatus and Pattern Shape Evaluating Apparatus "

* cited by examiner

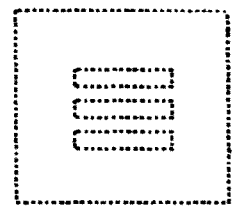
FIG. 5A
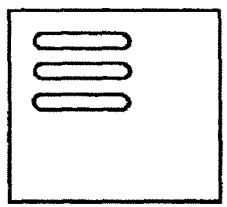
FIG. 5B
FIG. 5C
FIG. 5D
FIG. 5E
FIG. 5F
FIG. 5G
FIG. 5H FIG. 14D 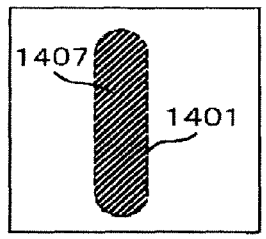 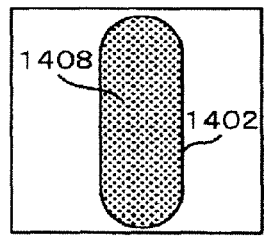
FIG. 15A
| point | length |
|-------|--------|
| 1 | L1 |
| 2 | L2 |
| 3 | L3 |
| ⋮ | ⋮ |
| n | Ln |
FIG. 15B
| point | judge |
|-------|-------|
| 1 | in |
| 2 | in |
| 3 | out |
| ⋮ | ⋮ |
| n | in |

FIG. 16
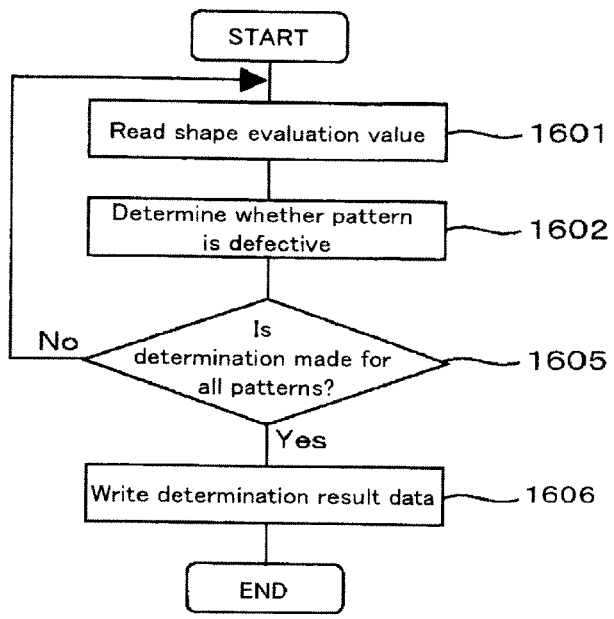
FIG. 17A          FIG. 17B          FIG. 17C
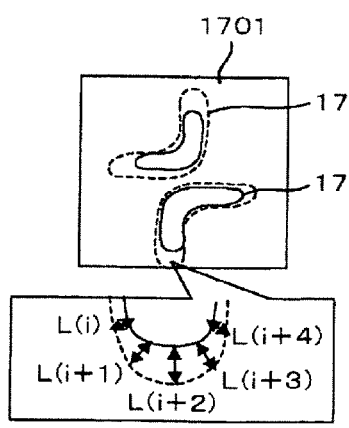   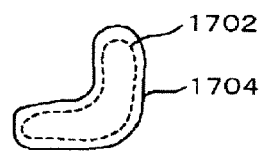   

Evaluation on contour distribution in density

Evaluation on contour distribution in range

Evaluation on contour distribution in density

Evaluation on contour distribution in range

PATTERN GENERATING APPARATUS AND PATTERN SHAPE EVALUATING APPARATUS

CROSS-REFERENCE TO RELATED APPLICATION

This application is a continuation of U.S. application Ser. No. 13/294,828 filed Nov. 11, 2011, now U.S. Pat. No. 8,363,923 which is a continuation of U.S. application Ser. No. 12/366,196 filed Feb. 5, 2009, now U.S. Pat. No. 8,077,962 which claims priority from Japanese Patent Application No. 2008-031314 filed Feb. 13, 2008. The contents of each are hereby incorporated by reference.

BACKGROUND OF THE INVENTION

1. Field of the Invention

The present invention relates to a pattern generating apparatus and a pattern shape evaluating apparatus for evaluating the shapes of circuit patterns for electronic devices by use of captured images of the circuit patterns, the circuit patterns being manufactured on a wafer, a reticle or the like.

2. Background Art

In recent years, higher densification and integration of a semiconductor device have been in progress for the purpose of improving the performance of the semiconductor device and reducing the manufacturing costs thereof. Producing semiconductor devices with much higher density and integration requires development of lithography technologies for forming fine circuit patterns on a silicon wafer. The lithography is a process in which a mask is formed as a master pattern for circuit patterns, and in which an exposure apparatus transfers the circuit patterns of the mask onto a photosensitive light-receiving resin (called a resist below) applied on a silicon wafer. The development of the lithography technologies is still in the trend toward finer patterning, thanks to various kinds of technological innovations in the phase shift mask technology, the modified illumination technology, in the scanning exposure technique, in the field of chemically amplified resist materials, and in other related fields.

For a circuit pattern having a minimum size smaller than a wavelength of light from an exposure light source, however, the conventional lithography technologies have a problem of an extreme reduction in a tolerance (hereinafter, called a process window) allowed for each process condition for lithography in the case where the process condition varies from its optimum condition.

There are a wide range of factors of such extreme reduction of the process window, for example, which include: unevenness of illumination accompanying a wavelength shortening of light from an exposure light source; non-uniformity in processes such as antireflection, bake, and development; and variations in mask size. These factors of variations in the lithography processes can be classified into an effective dose (simply called a dose below) that behaves in the same manner as variations in an exposure light amount, and an effective focus (simply called a focus below) that behaves in the same manner as variations in focus.

For this reason, in the course of development of new semiconductor devices, semiconductor manufacturers make an attempt to increase process windows through the following operations. In one of the operations, the process windows for a dose range and a focus range for manufacturing non-defective patterns are figured out by measuring test patterns with use of a length measuring SEM, the test patterns formed on a silicon wafer with the dose and focus being changed stepwisely (hereinafter, this operation is called a condition finding operation. See Japanese Patent Application Publication No. Hei 11-288879). In another one of the operations, optimum conditions for lithography are derived by repeatedly analyzing the factors of dose variations and focus variations through optical simulations.

As for processes on patterns in size of 65 nm or finer, however, the condition finding operation in the course of the development has a difficulty of finding the optimum process windows for all the combinations of pattern shapes and pattern arrangements due to a high density of the patterns and high pattern complexity. Accordingly, more importance is now placed on the monitoring of a deformation of a pattern shape caused by process variations in mass production processes.

An effective method for monitoring a deformation of a pattern shape caused by process variations in mass production processes is a method of obtaining a deformation amount in a pattern shape in a chip by comparing the pattern shape in the chip with the pattern shape of a pattern representing a non-defective pattern whose pattern shape is not deformed at all by the process variations (hereinafter, the pattern is called a reference pattern). As such pattern shape evaluation methods, there have been disclosed the inventions in which a pattern shape is evaluated by using the design data on an electronic device as the reference pattern (Japanese Patent Application No. Hei 7-260699, Japanese Patent Application Publications Nos. Hei 10-312461, 2002-6479 and 2001-338304 (corresponding to U.S. Pat. No. 6,868,175)), and the invention in which a pattern shape is evaluated by using a non-defective pattern as the reference pattern (Japanese Patent Application Publication No. Hei 10-312461).

SUMMARY OF THE INVENTION

The inventions disclosed in Japanese Patent Application No. Hei 7-260699, Japanese Patent Application Publications Nos. Hei 10-312461, 2002-6479 and 2001-338304, however, have a problem that it is difficult to form a circuit pattern, having exactly the same shape as the circuit pattern of the design data, on a silicon wafer because of the limitations of the performance of circuit pattern making apparatuses such as a mask making apparatus and an exposure apparatus. Thus, the shape evaluation method using the circuit pattern of design data as a reference particularly has a problem that the pattern shape is incorrectly evaluated due to a difference between the shapes of such ideal circuit pattern of the design data and actually formed circuit pattern. In order to address such a problem, Japanese Patent Application Publication No. 2002-6479 discloses a method of evaluating a pattern shape by using, as the reference pattern, a pattern that is obtained by deforming a pattern shape of design data in advance to represent a pattern shape to be actually formed on a silicon wafer. Nevertheless, due to the difficulty of completely predicting the pattern shape before its production, this method still has a problem that the disparity between the predicted pattern and an actually-produced pattern leads to an incorrect evaluation on the shape of the actually-produced pattern.

In consideration of the foregoing problems, one may come to the conclusion that an effective shape evaluation method is a method using, as a reference, the best pattern (a captured image of a perfect circuit pattern) among circuit patterns that are actually produced, as disclosed in Japanese Patent Application Publication No. Hei 10-312461. However, because each circuit pattern independently has locally-deformed portions like edge roughness and the like caused during the manufacturing process of the electronic devices, even the technique in Japanese Patent Application Publication No. Hei 10-312461 still suffers from the problem of the incorrect shape evaluation due to such locally-deformed portions in the circuit patterns.

Furthermore, there are other problems. Although an SEM is usually used as a means for capturing an image of a fine circuit pattern in order to evaluate the shape of the fine circuit pattern, the structure of the SEM inevitably causes the captured image to include noise and luminance unevenness to a large extent. The noise and luminance unevenness exert a harmful effect on image processing of extracting a pattern shape from an image captured by the SEM. This harmful effect impedes extraction of the exact pattern shape of a non-defective pattern from a captured image. Consequently, pattern shapes cannot be evaluated correctly for a portion where the exact pattern shape of the non-defective pattern has failed to be extracted. Moreover, it is not always guaranteed that a non-defective pattern appropriate for the reference pattern, i.e., a non-defective pattern free from the influence of process variations is formed on a wafer.

Hence, in order to address these problems, the present invention has been made as a pattern generating apparatus being used to evaluate a shape of a circuit pattern of an electronic device, and including: a reference pattern generating means for generating, from contour data sets of at least two circuit patterns, a reference pattern used in a pattern test, wherein the reference pattern generating means determines points that cross the at least two contour data sets and, in a direction applied to each portion of the patterns, respectively correspond to contour data of one circuit pattern and to contour data of another circuit pattern, and generates the reference pattern based on extraction of an average position between the corresponding point of the contour data of the one circuit pattern and the corresponding point of the contour data of the other circuit pattern, or a center position between the corresponding point of the contour data of the one circuit pattern and the corresponding point of the contour data of the other circuit pattern. In addition, the reference pattern generating means executes contour filling processing for a region interposed between the at least two contour data sets, and generates the reference pattern based on thinning processing performed on the filled region.

In addition, the pattern generating apparatus according to the present invention pattern further includes a means for performing pattern matching between one and another one of the contour data sets to determine a position for overlaying the contour data sets on one another, and the contour distribution data generating means generates the contour distribution data based on the position for overlaying the contour data sets on one another.

The pattern generating apparatus according to the present invention further includes a means for performing pattern matching between design data and each of the contour data sets to determine a position for overlaying the contour data set on the design data, and the contour distribution data generating means generates the contour distribution data based on the position for overlaying the contour data set on the design data.

Moreover, in the pattern generating apparatus according to the present invention, the contour distribution data generating means compares a shape of each of the contour data sets with a default value of the shape of the circuit pattern, and generates the contour distribution data only by using the contour data sets satisfying the default value of the shape of the circuit pattern.

Also, in the pattern generating apparatus according to the present invention, the reference pattern generating means figures out a distribution of contours from the contour distribution data, and sets the reference pattern within a range of the distribution of contours.

Additionally, in the pattern generating apparatus according to the present invention, the reference pattern generating means generates the reference pattern from the contour distribution data in reference to the shape of the design data of the circuit pattern.

Alternatively, in order to address the aforementioned problems, the present invention has been made as a pattern shape evaluating apparatus including the contour distribution data generating means, the reference pattern generating means and a shape evaluation means for generating a shape evaluation value of an evaluation target pattern with respect to the reference pattern by comparing the reference pattern with the evaluation target pattern.

Moreover, the pattern shape evaluating apparatus according to the present invention further includes a quality determination means for determining whether the evaluation target pattern is defective or not, by using the shape evaluation value.

In addition, in the pattern shape evaluating apparatus according to the present invention, the shape evaluation means calculates, as the shape evaluation value of the evaluation target pattern, a gap between the reference pattern and the evaluation target pattern is measured, or any of an average of the gaps, a dispersion of the gaps, and an area of the evaluation target pattern to the reference pattern, or determine, as the shape evaluation value, whether the evaluation target pattern exists outside or inside a pattern shape deformation tolerance provided to the reference pattern. Then, the quality determination means determines whether the evaluation target pattern is defective or not by comparing the shape evaluation value with a default value for determining whether the evaluation target pattern is defective or not According to the present invention, a pattern shape evaluating apparatus includes: all of or a part of the contour distribution data generating means, the reference pattern generating means, the shape evaluation means and the quality determination means; an imaging means for obtaining a captured image of the evaluation target pattern and captured images of the at least two circuit patterns for generating the reference pattern; a means for extracting contour data of the circuit patterns from the captured images; and a data storage means for storing the captured images, the contour data sets, the contour distribution data, and the reference pattern, the shape evaluation value and data on the quality determination result, which are obtained used and obtained through the pattern shape evaluation.

The pattern shape evaluating apparatus according to the present invention further includes a means for generating, from the design data of the circuit patterns, a recipe for obtaining a captured image of each of the circuit patterns by the imaging means.

Moreover, the pattern shape evaluating apparatus according to the present invention further includes a data display means for displaying the contour distribution data, the reference pattern and the data on the shape evaluation result.

Further, the pattern shape evaluating apparatus according to the present invention further includes a data input means for reflecting instructions from a user into the reference pattern generating means, the shape evaluation means and the quality determination means. Then, the reference pattern generating means, the shape evaluation means and the quality determination means generate the reference pattern and perform the shape evaluation on the basis of instruction data from the data input means.

In order to address the foregoing problems, the pattern generating apparatus according to the present invention further includes a data input means for reflecting instructions from a user into the reference pattern generating means, and the reference pattern generating means generates the reference pattern on the basis of instruction data from the data input means.

Furthermore, in order to address the foregoing problems, a pattern shape evaluating apparatus according to the present invention generates an image of a wafer map indicating the shape evaluation value and a result of the quality determination, and displays the image of the wafer map on the data display means.

Hence, according to the present invention, a reference pattern used in shape evaluation of circuit patterns of electronic devices is generated from captured images of multiple circuit patterns. Thus, the present invention enables the generation of the reference pattern which is suitable for the manufacturing conditions for circuit patterns and is less affected by distortion of each of the circuit patterns. By comparing each evaluation target pattern with this reference patter, the pattern shape evaluation can be performed with high accuracy.

BRIEF DESCRIPTION OF THE DRAWINGS

FIGS. 5A to 5H are diagrams showing a procedure of overlaying contour data sets on one another.

FIGS. 14A to 14D are diagrams showing an example of shape comparison between the reference pattern and the evaluation target pattern.

FIGS. 15A and 15B are diagrams showing table data in which results of the shape evaluation values are stored.

FIG. 16 is a flowchart showing a procedure of determining whether a pattern is defective or not.

FIGS. 17A to 17C are diagrams showing an example of measurement of a pattern gap.

Figure 1:
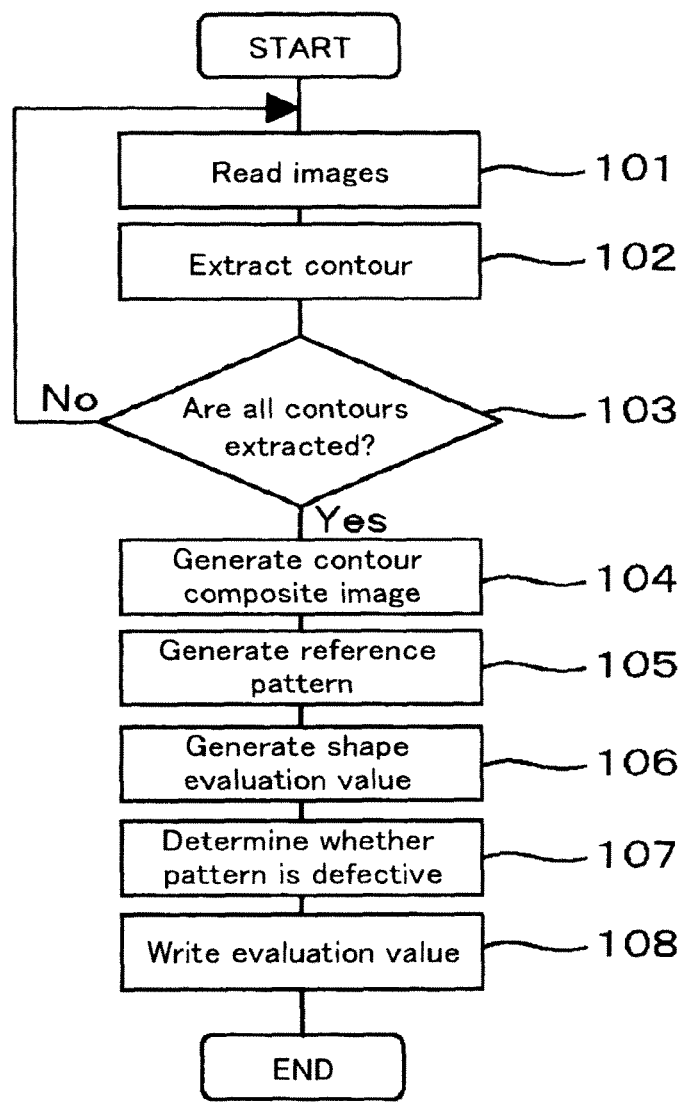
FIG. 1 is a flowchart showing a pattern shape evaluation method described in Embodiment 1 of the present invention.

DESCRIPTION OF SYMBOLS 201 wafer
202 electro optical system
203 electron gun
204 electron beam
205 condenser lens
206 deflector
207 ExB deflector
208 object lens
209 secondary electron detector
210, 211 reflection electron detector
212 to 214 analog to digital convertor
215 processing controller
216 display
217 stage
219 stage controller
220 deflection controller
221 focus controller
223 storage device
225 imaging recipe generator
230 design system
251 central processing unit
252 image memory
253 large-scale integration
301, 305 wafer
302 shot area
303 chip
304 pattern in chip
306 relationship between patterns of different wafers
307 relationship between patterns of different shot areas
308 relationship between patterns of different chips
309 in-FOV pattern
401 white band
402 background
403 contour of pattern
501 shift amount A
502 shift amount B
503 shift amount C
504 contour overlay position
701 shift amount 702 to 704 contour composite point
705 to 707 composite region
708 coordinates
900, 1211 design data
901 center line of design data
902 normal line to center line of design data
903, 2603 outer border of contour distribution
904 center of contour distribution
905, 2601 inner border of contour distribution
906, 907, 908 intersection of center of contour distribution and normal line
909, 910 end point of center line of design data
1201 inner border
1202 outer border
1203 center position of contour distribution
1210 cursor
1212 center line
1213, 1214 point of reference pattern
1401, 1702, 2103 reference pattern
1402 evaluation target pattern
1403 gap
1404 band
1405 defective portion of evaluation target pattern
1406 tolerance of shape deformation with respect to reference pattern
1407, 1408 region
1409 point on reference pattern
1410 point
1701 contour data region
1703, 1704, 1705 pattern
1801 quality determination result
2001, 2002 contour data
2101 contour data A
2102 contour data B
2003 position correction amount
2301 design layout
2302 focus point
2303 addressing point
2304 brightness/contrast point
2305 shape evaluation point
2306 automatic astigmatism point
2401, 2402 point
2403, 2404 contour distribution border
2501 vertex coordinate data
2502 center line of design data
2602 center pattern

DETAILED DESCRIPTION OF THE PREFERRED EMBODIMENTS

Hereinafter, preferred embodiments will be described with reference to the drawings.

First Embodiment

Figure 2:
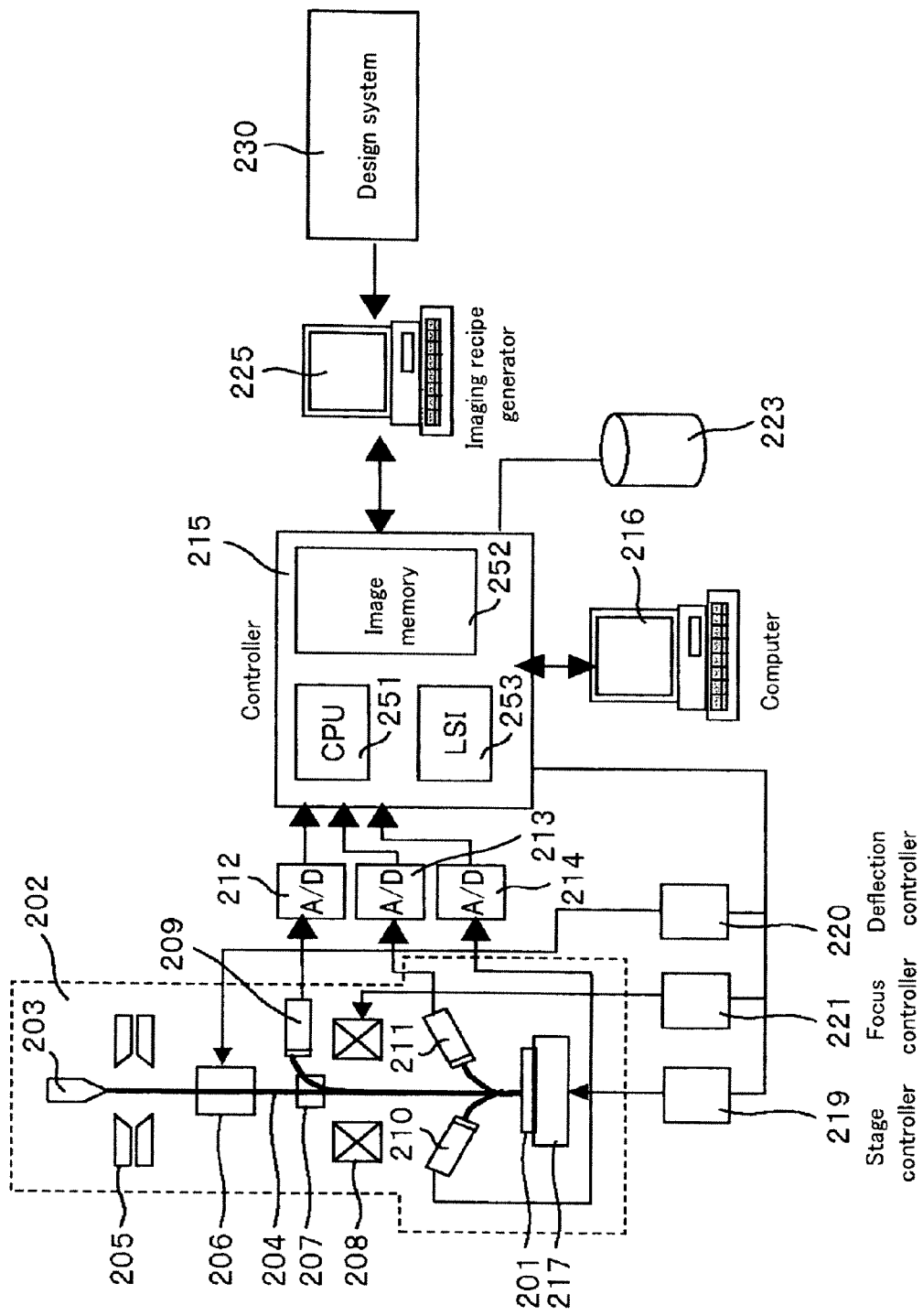
FIG. 2 is an overview diagram of the configuration of a pattern shape evaluating apparatus according to the present invention.

FIG. 2 shows an overview of configuration blocks of a scanning electron microscope a scanning electron microscope (abbreviated as SEM, below) that captures images of circuit patterns according to the present invention. An electro-optical system 202 includes: an electron gun 203 that generates an electron beam (primary electrons) 204; a condenser lens 205 that converges the electron beam 204 generated from the electron gun 203; a deflector 206 that defects the converged electron beam 204; an ExB deflector 207 that detects secondary electrons; and an object lens 208 that causes the converged electron beam 204 to form an image on a semiconductor wafer 201. The wafer 201 is placed on an XY stage 217. After that, the deflector 206 and the object lens 208 control the radiating position and the diaphragm of the electron beam so that the electron beam can be radiated and focused on a desired position on the wafer 201 placed on the XY stage 217. Meanwhile, the XY stage 217 also allows a desired position of the wafer 201 to be imaged by moving the wafer 201. Here, changing an observation position by the XY stage 217 is referred to as a stage shift, whereas changing an observation position through defection of the electron beam by the deflector 206 is referred to as a beam shift. From the wafer 201 irradiated with the electron beams, secondary electrons and reflection electrons are emitted. The secondary electrons are detected by a secondary electron detector 209, while the reflection electrons are detected by reflection electron detectors 210, 211. The reflection electron detectors 210, 211 are arranged at different locations. The secondary electrons and reflection electrons detected by the secondary electron detector 209 and the reflection electron detectors 210, 211 are converted into digital signals by analog to digital (A/D) converters 212, 214, 213, respectively. Then, the digital signals are inputted to a processing controller 215, and are stored in an image memory 252. A central processing unit (CPU) 251, an large-scale integration (LSI) 253 that is image processing hardware, and the like perform image processing on the stored digital signals according to a purpose and thereby evaluate the shapes of circuit patterns. More specifically, the processing controller 215 transmits control signals to a stage controller 219 and a deflection controller 220 in order to capture images of shape evaluation points based on an imaging recipe being generated by an imaging recipe generator 225, which will be described later, and indicating a procedure of shape evaluating. Then, the processing controller 215 performs processing and control for various types of image processing and the like on the observed images on the wafer 201 to evaluate the shape of the circuit pattern.

Here, the processing controller 215 is connected to: the stage controller 219 that controls the position and movement of the stage 217, including global alignment control for correcting a shift of the wafer 201 from the origin or correcting rotation of the wafer 201 by observing global alignment marks on the wafer 201 with an optical microscope (not shown) or the like; the deflection controller 220 that controls the deflector 206 to control the beam shift (beam deflection) of the electron beam; and a focus controller 221 that controls the object lens 208 to perform focus control. In addition, the processing controller 215 has functions such as a graphical user interface (GUI) that is connected to a display 216 including an input means and shows a user images, shape evaluation results and the like on the display 216. Incidentally, although this embodiment shows the two detectors provided for reflection electron images, the number of detectors for reflection electron images can be increased or decreased. In addition, the aforementioned processing and control can be performed with the control, which is to be performed by the processing controller 215, partially or entirely allocated to another computer or the like including a central processing unit (CPU) and a memory capable of cumulatively storing images.

The processing controller 215 is further connected to the imaging recipe generator 225 through a network, bus or the like. The imaging recipe generator 225 generates the imaging recipe including the coordinates of a circuit pattern; a template of the design data for positioning corresponding to the coordinates; information on imaging conditions (including an imaging scale factor, image quality and the like) for SEM observation; and the like. In order to obtain design data, the imaging recipe generator 225 is connected to a design system 230 such as an electronic design automation (EDA) tool through a network or the like. The imaging recipe generator 225 generates an imaging recipe, by using design data and information on the image pickup points on a wafer targeted for the shape evaluation, and is equivalent to an imaging recipe generator disclosed, for example, in Japanese Patent Application Publication No. 2006-3517146. The concept of generating an imaging recipe from design data was proposed a long time ago, and this description is not intended to limit imaging recipe generation methods and apparatuses to which the present invention is applicable. In general, the imaging recipe generation is executed through software processing with a computer in which a central processing unit (CPU), memory and the like are mounted, or through hardware processing with hardware in which a central processing unit (CPU), application specific integrated circuits (ASIC), field programmable gate array (FPGA), memory and the like are mounted.

Figure 22:
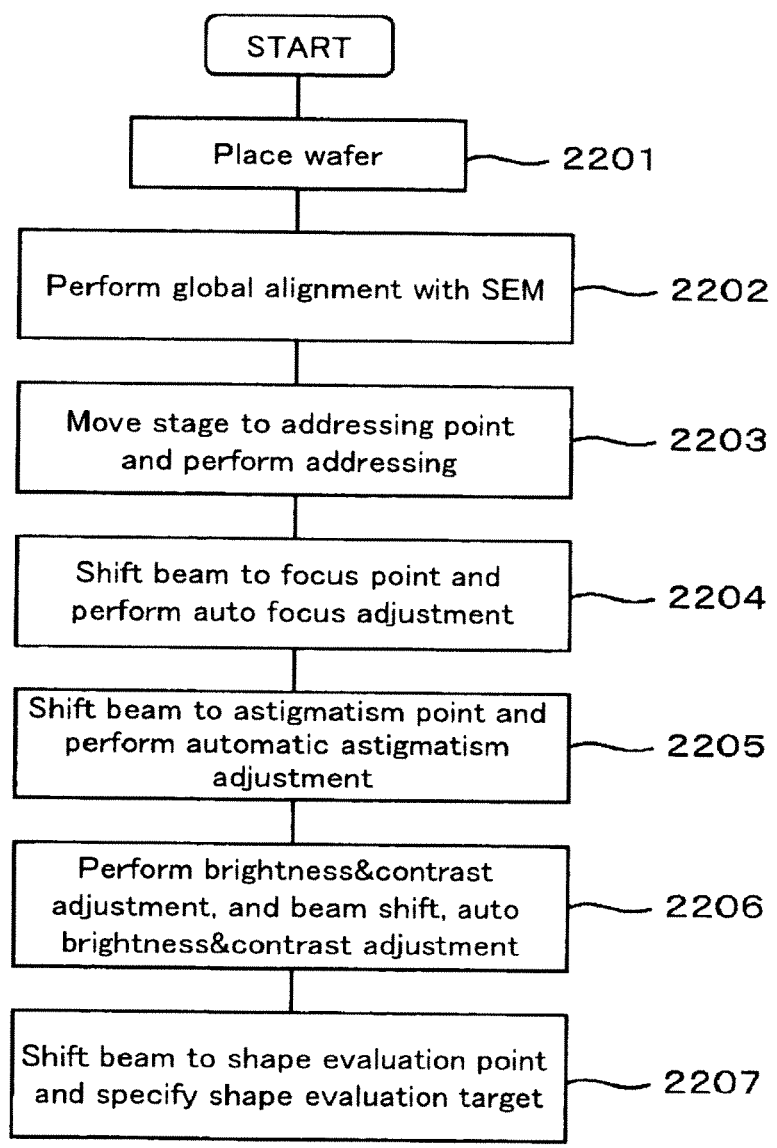
FIG. 22 is a flowchart showing an image capture sequence of an SEM.
Figure 23:
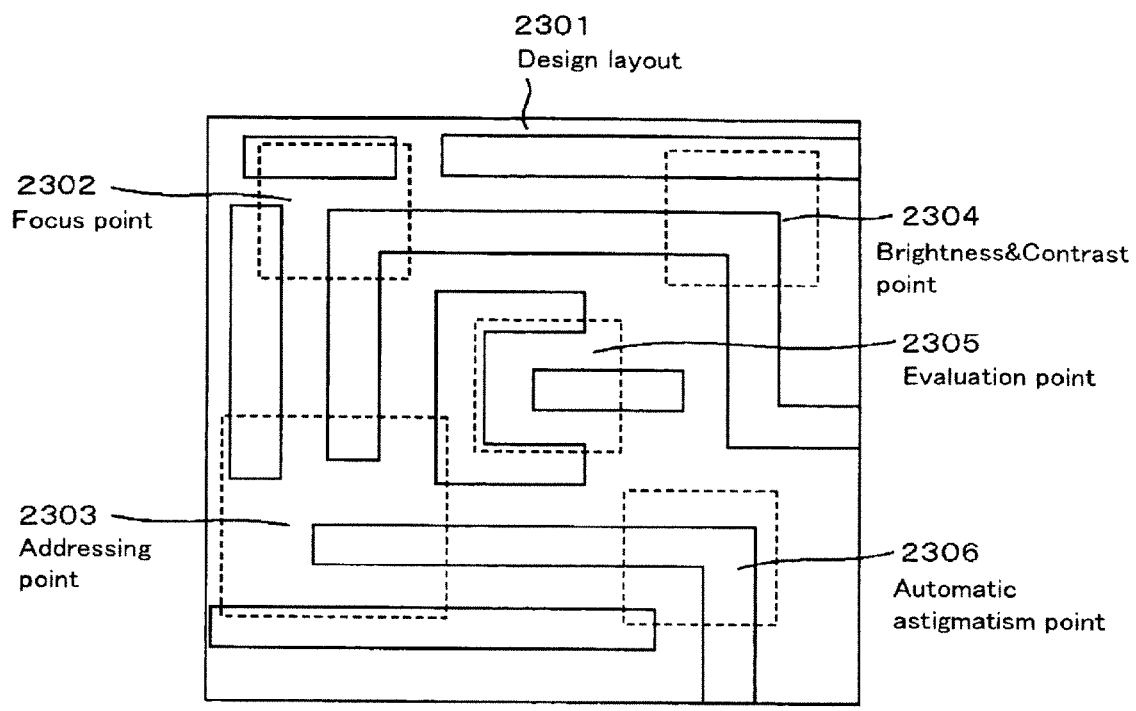
FIG. 23 is a diagram of a layout for the image capture sequence of the SEM.

Next, an imaging sequence for observing a desired shape evaluation point (abbreviated as EP below) on a wafer will be described by use of FIG. 22. FIG. 23 shows setting examples of an addressing point (abbreviated as AP below) 2303, an auto-focus point (abbreviated as FP below) 2302, an automatic astigmatism point (abbreviated as SP below) 2306 that is an astigmatism correction point, a brightness/contrast point (abbreviated as BP below) 2304 that is a brightness/contrast adjustment point, with respect to an EP 2305 on a design layout 2301. Based on the information on the design data and the shape evaluation point, the imaging recipe generator 225 generates, as the imaging recipe, an image capture point and image capture conditions (including an imaging scale factor, image quality and the like) in the imaging sequence, and also shape evaluation conditions for the EP. The imaging recipe thus generated is stored and managed, for example, in a storage device 223.

In the first place, the wafer 201 as a sample is placed on the stage 217 (2201). Then, the processing controller 215 calculates the shift from the origin and the rotational shift of the sample on the basis of a result from an observation of global alignment marks on the sample by means of the optical microscope (not shown) or the like, and corrects these shifts by controlling the stage 217 through the stage controller 219 based on the calculated shift amounts (2202). After that, the processing controller 215 moves the stage 217 to shift the image capture position to the AP according to the coordinates of the image capture point and the imaging conditions generated by the imaging recipe generator 225, and then captures an image of the AP under the imaging conditions with a smaller scale factor than when the image of the EP is captured (2203). Here, more detailed explanation is provided for the AP. In a trial to directly observe the EP, this observation target point may be located out of the field of view of the SEM due to poor positioning accuracy of the stage 217 and the like. To solve this problem, the AP is used as follows. Having the known coordinates, the AP generated by the imaging recipe generator 225 and registered in the storage device 223 in advance is once observed for positioning. Then, the processing controller 215 performs matching of the design data template at the AP generated by the imaging recipe generator 225 and registered in the storage device 223 in advance, and the SEM image of the observed AP. Thereby, the processing controller 215 detects a shift vector between the center coordinates of the design data template and the center coordinates of the AP actually observed. Thereafter, the processing controller 215 moves the image capture position by controlling the deflector 206 through the deflection controller 220 so that the beam shift (the radiation position of the beam is changed by tilting the beam radiation direction) can be performed by a distance obtained by subtracting the shift vector from the relative vector between the coordinates of the design data template and the coordinates of the EP. When the EP is observed after this positioning adjustment, the image of the EP can be captured with high coordinates accuracy (In general, the positioning accuracy of the beam shift is higher than the positioning accuracy of the stage). Thereafter, the processing controller 215 performs control and processing to shift the image capture position to the FP by the beam shift, to capture an image of the FP, to obtain parameters for autofocus and to perform the autofocus based on the obtained parameters (2204).

Subsequently, the processing controller 215 performs control and processing to shift the image capture position to the SP by the beam shift, to capture an image of the SP, to obtain parameters for astigmatism correction and to perform the automatic astigmatism correction based on the obtained parameters (2205).

Next, the processing controller 215 performs control and processing to shift the image capture position to the BP by the beam shift, to capture an image of the BP, to obtain parameters for brightness&contrast adjustment and to perform the brightness&contrast adjustment based on the obtained parameters (2206). Incidentally, the addressing, the autofocus, the automatic astigmatism correction, the automatic brightness&contrast adjustment in the aforementioned steps 2203, 2204, 2205 and 2206 are performed in different manners depending on occasions. For example, one, some or all of the steps 2203, 2204, 2205 and 2206 are skipped; the order of executing the steps 2203, 2204, 2205 and 2206 is changed as needed; or some of the AP, FP, SP and BP have the same coordinates (for instance, the autofocus and the automatic astigmatism correction are preformed on the same point). In the last place, the processing controller 215 performs control and processing to shift the image capture position to the EP by the beam shift, to capture an image of the EP, to perform matching of the design data template at the EP registered in the storage device 223 and the SEM image of the observed EP, and to calculate a shift amount of a shape evaluation target point in the SEM image (2207).

After the imaging, the pattern shape evaluation according to the present invention is performed by use of the SEM image of the EP and the shift amount obtained by the EP matching. In the pattern shape evaluation, a reference pattern is firstly generated from captured images of multiple patterns of different production points on a wafer or different wafers so that pattern deformation due to process variations, and pattern shape distortion due to noise included in the images, and distortion due to roughness or the like included in each of the patterns can be eliminated as much as possible. After that, the shapes of the reference pattern and the evaluation target pattern are compared with each other, and thereby a shape evaluation value of the evaluation target pattern is obtained with respect to the shape of the reference pattern. Note that, the aforementioned multiple patterns are those based on an equal shape in the design data.

Figure 3:
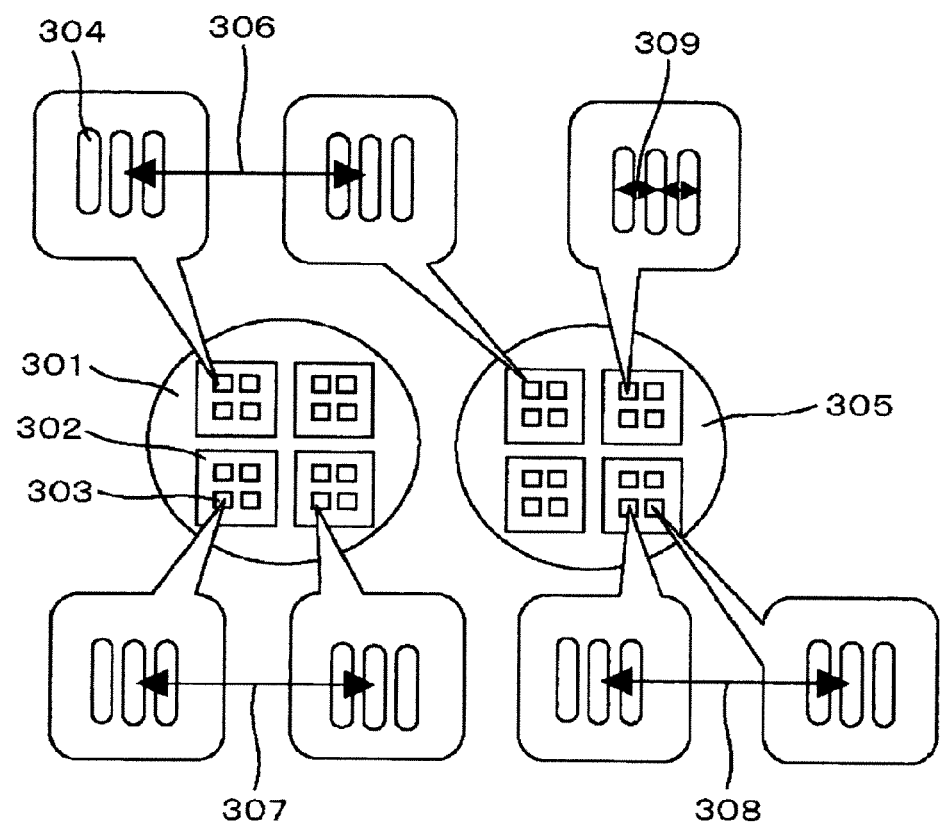
FIG. 3 is a diagram showing patterns of different wafers, patterns of different shot areas, patterns of different chips, and patterns of the same chip.

The multiple patterns are patterns, for example, under the following conditions (A) to (D). FIG. 3 shows relationships under the conditions (A) to (D), and shows relationships among two wafers 301 and 305, a shot area 302 in the wafer 301, a chip 303 in the shot area, and a pattern 304 in the chip. Here, the shot area is an exposure area transferable at one time and multiple chips are included within one shot area.

(A) Multiple patterns from different wafers (an example 306)

(B) Multiple patterns from different shot areas (an example 307)

(C) Multiple patterns from different chips in the same shot area (an example 308)

(D) Multiple patterns having different coordinates in the same chip (an example 309)

The above conditions are only one example, and the reference pattern may be generated by use of multiple patterns under a combination of the conditions (A) to (D).

Hereinafter, a pattern shape evaluation method according to the present invention will be described in detail.

FIG. 1 shows a flowchart of the pattern shape evaluation method according to the present invention. The pattern shape evaluation method is executed through software processing with use of the central processing unit (CPU) 251, the image memory 252 and the like in the processor controller 215. Instead, the pattern shape evaluation method may also be executed through software processing with a central processing unit (CPU), a memory and the like in a computer to which images and the design data template can be inputted from the electro optical system 202 and the imaging recipe generator 225, respectively, via a LAN or a bus, or via a storage medium such as a portable memory and a hard disk. Each of steps will be described below in detail.

Firstly, captured images of circuit patterns are read (101). The images used in the pattern shape evaluation are obtained by controlling the electro optical system 202 according to the recipe, generated by the imaging recipe generator 225, for capturing the images of the evaluation target pattern and the multiple patterns that are under conditions such as the above conditions A to D and are used for reference pattern generation.

Figure 4A:
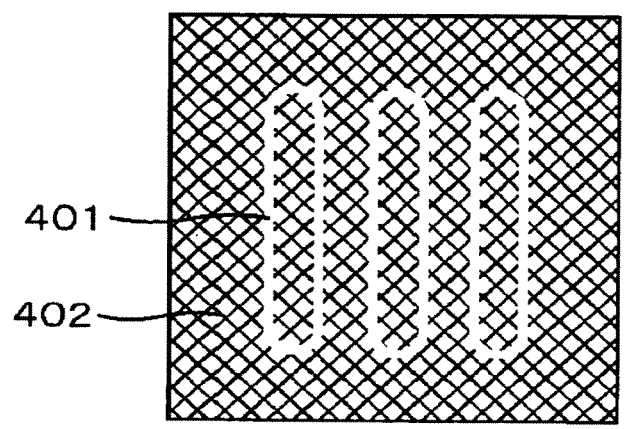
FIGS. 4A and 4B are diagrams of a captured image of a pattern and a contour data set of the pattern extracted from the captured image.
Figure 4B:
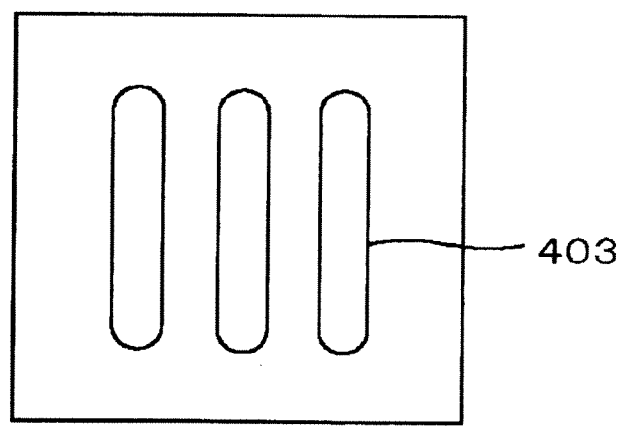

Next, contour lines of each of the circuit patterns are extracted from the image (102). Various methods for extracting contour lines have been proposed. An applicable method here is, for example, the method disclosed in Japanese Patent Application Publication No. 2006-66478, the method disclosed in "R. Matsuoka, New method of contour based mask shape compiler, SPIE Proc 6730-21, 2007.9.21," or the like. When the image of the pattern is captured by the SEM, inclined parts and protruding parts in the pattern are imaged as white-band-shaped images (hereinafter, referred to as white band images 401) on a background 402, as shown in FIG. 4A. With the application of any of the aforementioned methods and the like, the white band images 401 can be extracted as a contour data set 403 on a line image as shown in FIG. 4B. The image reading (101) and contour extraction (102) are performed for all the images including the images for the reference pattern generation and the image of the evaluation target pattern (103).

Then, the reference pattern is generated by use of multiple contour data sets extracted from the images for the reference pattern generation. In order to eliminate pattern shape deformation due to process variations, pattern distortion due to the roughness or the like occurred in each of the patterns, and contour distortion due to noise included in the images as much as possible, it is preferable to use a largest possible number of patterns to generate the reference pattern.

Contour Compositing

Figure 21A:
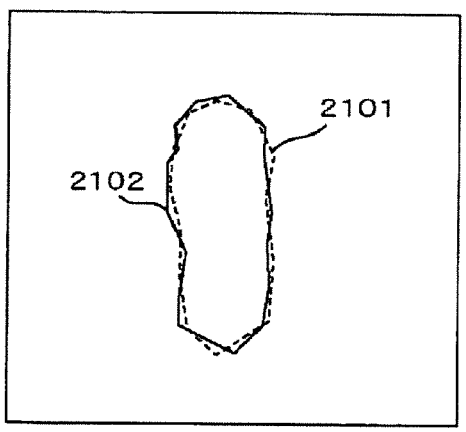
FIGS. 21A and 21B are views showing an example of combining contour data sets.

As preparation for the reference pattern generation, multiple contour data sets 2101 and 2102 extracted from the images are overlaid on one another, as shown in FIG. 21A, and thereby a composite of the contours is generated (104). As described above, if the contour positions of the patterns in the images are different among the contour data sets because of the problem of the positioning accuracy of the stage, the contour data sets are overlaid on one another in consideration of the contour positions in the images. An overlay position can be automatically identified by use of the EP matching result that is used to identify the shape evaluation point. A method of automatically identifying the overlay position is explained here by using FIGS. 5A to 5H. FIGS. 5A to 5C show three images of contour data sets for the reference pattern generation. Due to the problem of the stage positioning accuracy and the like, the contour positions in the three images are different among the contour data sets. FIG. 5D shows a design data template used for matching. As a result of the EP matching, shift amounts 501, 502 and 503 of the images in FIGS. 5E, 5F and 5G from the design data template can be detected. Based on these shift amounts, an overlay position 504 for these three contour data sets is identified as shown in FIG. 5H. There have been various methods for detecting the shift amount from the design data and the contour data by finding a matching position with high accuracy, even though the two types of data have different shapes, while absorbing such a shape difference. The shift amount can be detected with application of the method disclosed, for example, in Japanese Patent Application Publication No. 2007-79982.

Figure 6:
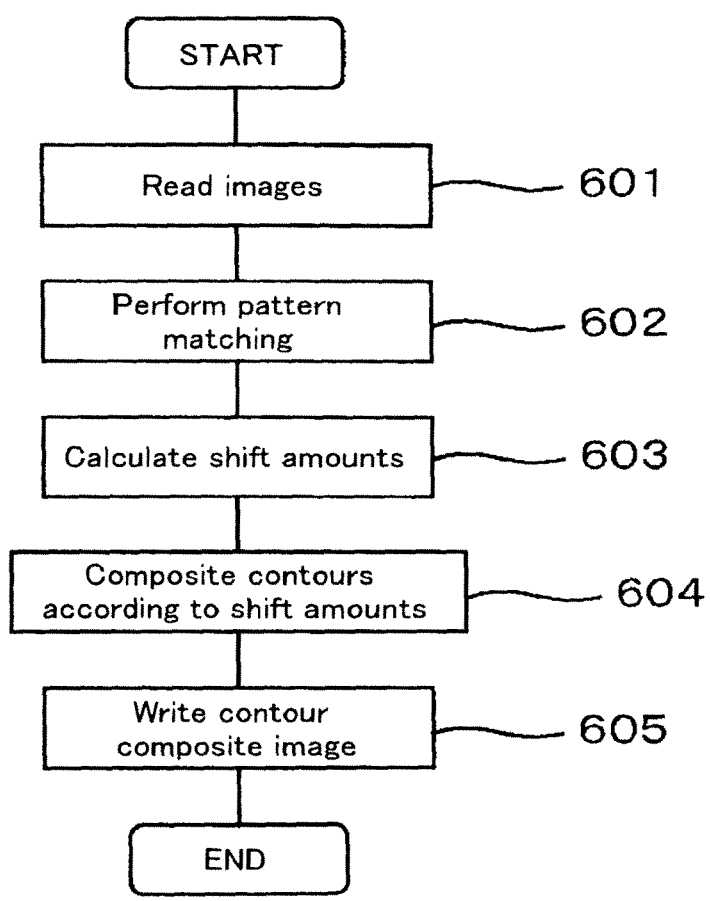
FIG. 6 is a flowchart showing a procedure of generating contour composite data.

FIG. 6 shows a processing flow of the contour data overlay. Firstly, multiple contour data sets (or images before contour extraction) are read (601). Then, matching of each of the contour data sets (or the images before contour extraction) with the design data template is performed (602). Based on the matching result, the shift amount of each of the contour data sets from the design data template is calculated (603). After that, the multiple contour data sets are overlaid by using the shift amounts as references to generate a composite image (604). The contour composite image is written to a memory or the like (605).

Figure 7A:
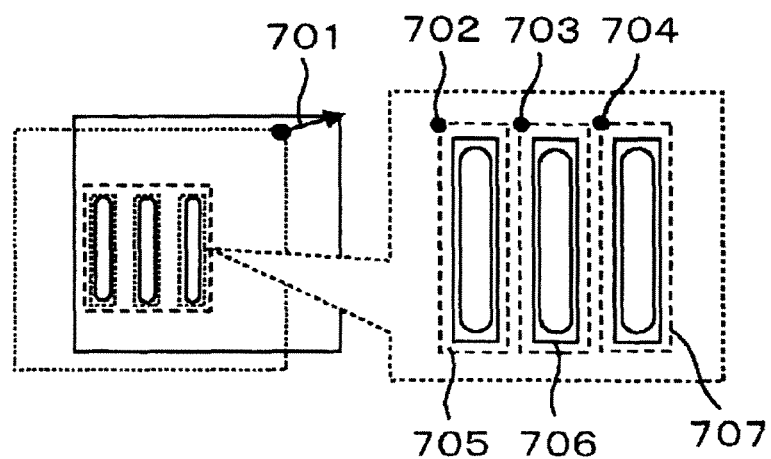
FIGS. 7A and 7B are diagrams showing a procedure of overlaying contour data sets of the same focus of view (FOV).
Figure 7B:
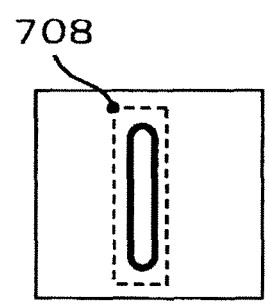
Figure 8:
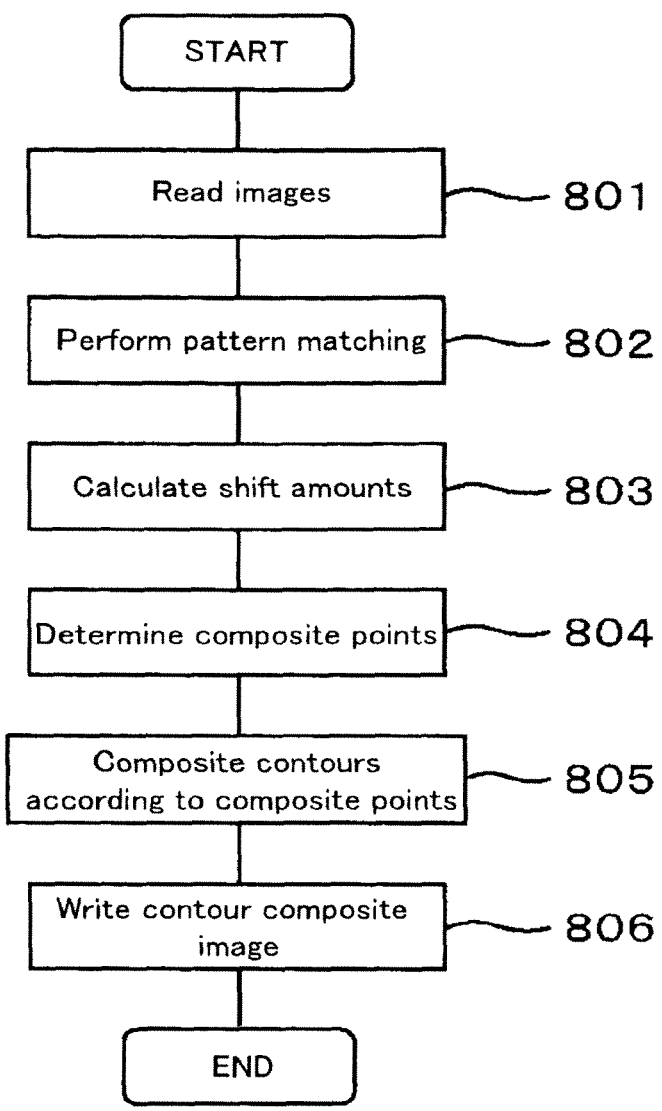
FIG. 8 is a flowchart showing a procedure of generating contour composite data from contour data sets of the same FOV.

In addition, even in the case where a single image includes multiple patterns to be overlaid, the patterns can be overlaid easily by use of the shift amount obtained by the EP matching and pattern intervals obtained from the design data. An example of overlaying multiple contours of a contour data set of one image is described by use of processing overview diagrams in FIGS. 7A and 7B, and a flowchart in FIG. 8. Firstly, a contour data set is read (801). Then, pattern matching of the contour data set (or the image before contour extraction) with the design data template is performed (802, equivalent to the EP matching). Based on the pattern matching result, a shift amount (701 in FIG. 7A) is calculated (803). After that, contour composite points 702 to 704 and composite regions 705 to 707 on the contour data set are determined according to the shift amount 701 and the pattern arrangement intervals on the design data (804). Next, a contour composite image is generated based on the contour composite points 702 to 704 and the composite regions 705 to 707 (805). FIG. 7B shows an image in which the contour data of the composite regions 705 to 707 are overlaid on one another with the contour composite points 702 to 704 arranged at coordinates 708 in a contour composite image. In the last place, the contour composite image is written to the memory (806). Incidentally, a user can specify the contour composite points and the composite regions through the input means connected to the display 216. In this case, the contour data set is displayed on the display 216, and the contour composite points and the composite regions specified through the input means are stored in the memory. The contour data are combined based on the contour composite points and the composite regions, and the resultant image is written in the memory.

Figure 12A:
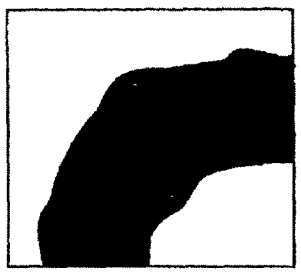
FIGS. 12A to 12F are diagrams showing a method of determining points of the reference pattern from contour distribution data.
Figure 12B:
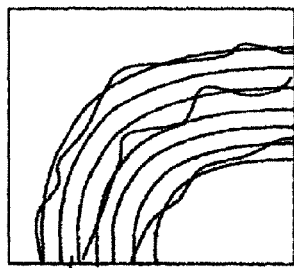
Figure 21B:
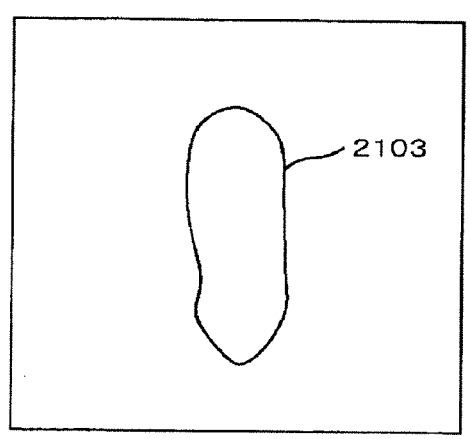

FIG. 12A shows an example of a contour composite image. When the evaluation target patterns have different shapes attributed to process variations and roughness or the like in individual patterns, a contour composite image obtained by overlaying the contours has a distribution of the pattern shapes (called a contour distribution below) as shown in FIG. 12B. A reference pattern 2103 as shown in FIG. 21B is generated from such contour composite image (105).

Reference Pattern Generation

The reference pattern is determined from the distributed contours of the contour composite image in accordance with a predetermined rule. The predetermine rule should be changed according to a purpose of shape evaluation, and is not limited to those described herein. The following description provides two examples of generating the reference pattern from the contour composite image.

1) Average Shape in Contour Distribution

Figure 24A:
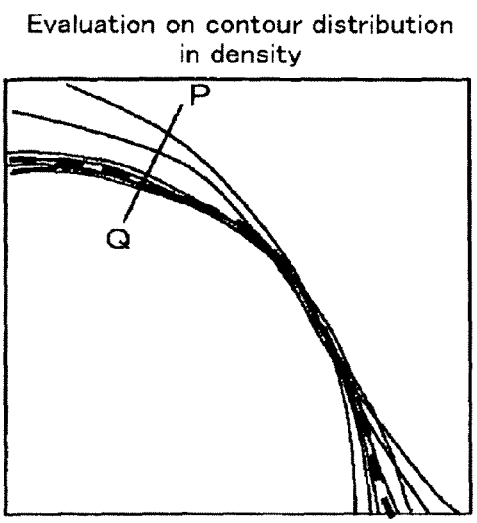
FIGS. 24A to 24D are diagrams showing an example of determining a reference pattern from contour distribution data.
Figure 24B:
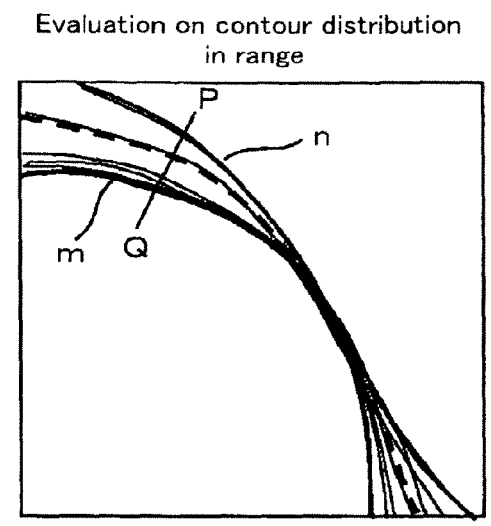
Figure 24C:
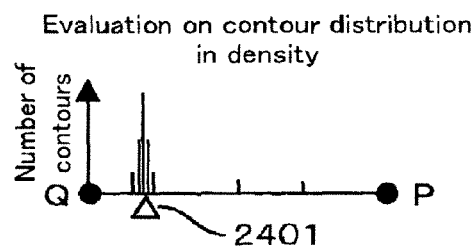

The reference pattern is formed by use of average points in the contour distribution. The shape evaluation of the evaluation target pattern with respect to the average pattern shape can be made by comparing the shapes of this reference pattern and the evaluation target pattern. FIG. 24A shows a contour distribution, and shows an example of forming the reference pattern (shown by a broken line) by use of the average points in the contour distribution. FIG. 24C shows a graph of the number of contours on a straight line Q-P in the contour distribution, and shows a point 2401 of the average reference pattern in the contour distribution on the Q-P line.

In order to determine the average point in the contour distribution, the number of overlapping contours needs to be stored as a pixel value of the contour composite image at the time of the generation of the contour composite image. Then, this contour composite image is processed through the moving average filter described in a chapter of "Smoothing and Noise Elimination" of p. 11 in "Tamura Hideyuki, Konputa gazo shori (computer image processing), (hereinafter, called Reference Document 1)" or the like, whereby the contour composite image having a peak at the average point in the contour distribution is generated. Eventually, the peak points continuing in the contour distribution are identified, and the thus identified peak points are determined as the reference pattern (the broken line in FIG. 24A).

2) Central Shape Between Contour Distribution Borders

Figure 24D:
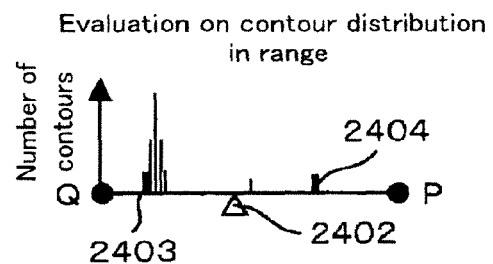

The reference pattern is formed by use of the center between contour distribution range borders. The shape evaluation of the evaluation target pattern with respect to the center in the shape variation range of the evaluation target pattern can be made by comparing the shapes of this reference pattern and the evaluation target pattern. FIG. 24B shows the same contour distribution as in FIG. 24A, and shows an example of forming the reference pattern (shown by a solid line) by use of the center in the contour distribution range. FIG. 24D shows a graph of the number of contours on a line Q-P, and shows contour distribution borders 2403 and 2404 on the line Q-P and a point 2402 of the reference pattern located on the center between the contour distribution borders 2403 and 2404.

Figure 10:
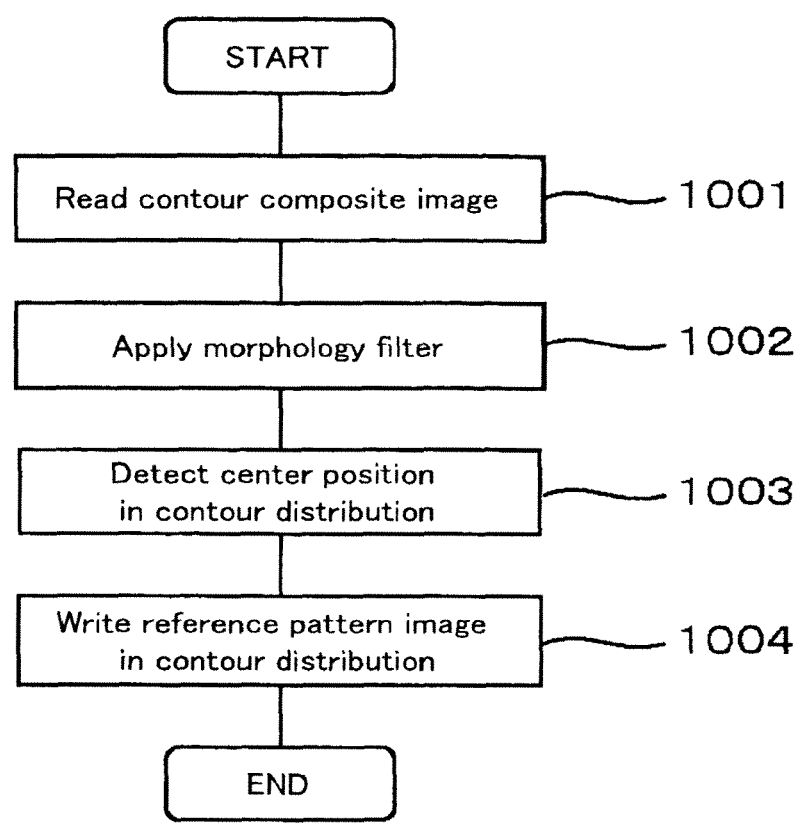
FIG. 10 is a flowchart showing one method of generating a reference pattern from contour composite data.

FIG. 10 shows a flowchart of a method of detecting the center between contour distribution borders from a contour composite image.

Figure 12C:
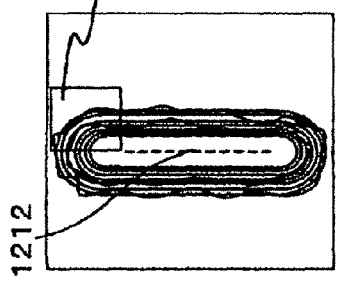

In the first place, a contour composite image is read (1001). Then, contour filling is performed (1002). FIG. 12B is an enlarged diagram of a contour distribution in the contour composite image shown in FIG. 12A. The contour distribution includes a point where a contour exists, and a point where no contours exist. The contour filling is processing in which the same value as a value of the contour is written to pixels within a range between the contours. For example, when the contour composite image is of binary data with a pixel value "1" at each point where the contour exists and with a pixel value "0" at each point where no contours exist, all the pixel values within the region between the contours are changed to "1" as shown in FIG. 12C by applying an image processing method such as a morphology filter (expansion processing→contraction processing) shown in a chapter "Contraction and Expansion" on p. 154 of Reference Document 1.

Figure 12D:
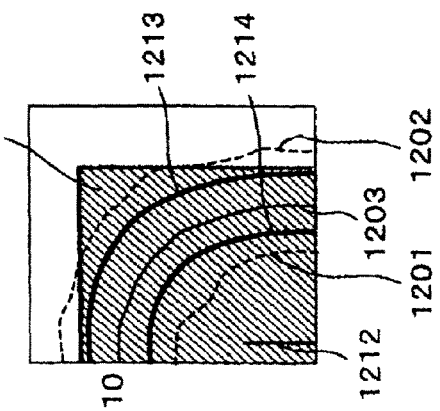

Then, by use of the data resulting from the contour filling, a center position 1203 in the contour distribution is detected (1003). This center position detection can be implemented with application of thinning processing described in a chapter "Thinning" on p. 158 of Reference Document 1, for example. The thinning processing is processing for figuring out the center line of a widely distributed pattern. The center position 1203 in the contour distribution as shown in FIG. 12D can be obtained by thinning the filled contour distribution. This center position in the contour distribution is written as the reference pattern to a memory or the like (1004).

Figure 11:
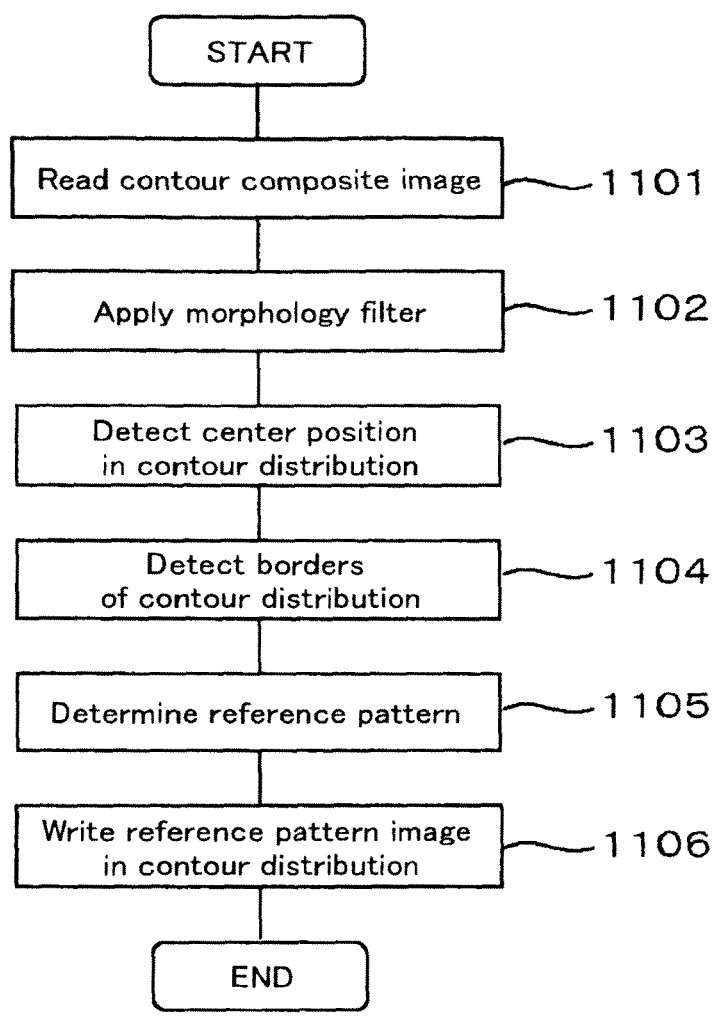
FIG. 11 is a flowchart showing another method of generating a reference pattern from contour composite data.
Figure 12E:
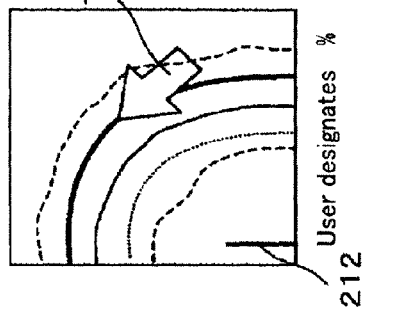
Figure 12F:
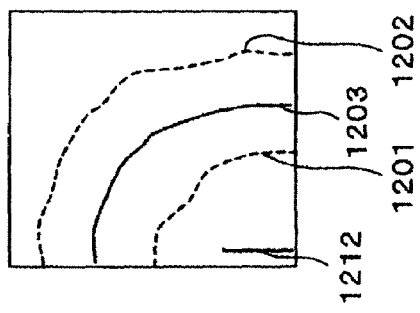

Instead of use of the center position between the contour distribution borders, the position of the reference pattern may be determined by use of points 1213 or 1214, which are located several pixels shifted from the center position 1203 in the contour distribution toward an outer border 1202 or an inner border 1201, respectively, as shown in FIG. 12F. FIG. 11 shows a processing flow of a method of generating such reference pattern. Here, since steps 1101 to 1103 include processing equal to the processing in steps 1001 to 1003 in the processing flow in FIG. 10, the explanation thereof is omitted.

After the center position in the contour distribution is identified, the inner border 1201 and the outer border 1202 shown in 12D are identified (1104). Assume that a contour distribution image in which the pixel values of the filled contour are "1" while the pixel values of the region other than the contour are "0." In this case, a point where the pixel values are changed from "0" to "1" when viewed from a center line 1212 of an entire circuit pattern shape is determined as the inner border 1201, while a point where the pixel values are changed from "1" to "0" when viewed from the center line 1212 is determined as the outer border 1202. The center line of the pattern shape in the contour distribution image can be determined by use of the shift amount of the contour data set (one of the multiple patterns) from the design data 1211 obtained by the EP matching; and the center line 1212 of the entire circuit pattern of the design data. A method of finding the center line position of the pattern shape from the design data will be described with reference to FIGS. 25A to 25C.

Figure 25A:
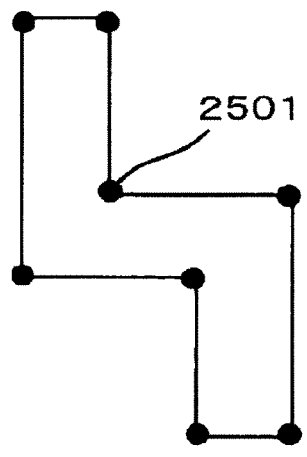
FIGS. 25A to 25C are diagrams showing design data of a circuit pattern and a relationship between the design data and the center line of the pattern.
Figure 25B:
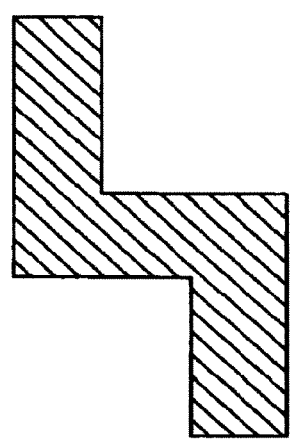

The design data is provided by a design system 230 or the like as a set of vertex coordinate data 2501 of multiple vertexes that constitute a closed figure of the pattern as shown in FIG. 25A. The pattern of the design data is obtained by connecting these vertex coordinates with a straight line. The pattern composed of the straight lines is drawn and an image having the inside of the pattern filled as shown in FIG. 25B is created. In this image, for example, the straight lines and the filled region of the design data are set to have the pixel values "1," and the region other than these are set to have the pixel values "0."

Figure 25C:
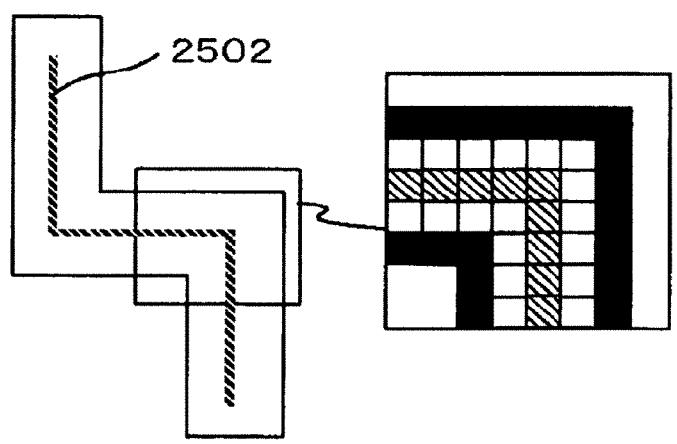

Subsequently, a center line 2502 in the pattern shape of the design data as shown in FIG. 25C is figured out by performing the aforementioned thinning processing on the image having the inside of the pattern thus filled.

The center line 1212 in the contour distribution image can be figured out based on the center line position of the pattern shape of the design data and the shift amount obtained by the EP matching. Then, the inner border 1201 and the outer border 1202 can be figured out according to the positional relationships between the center line 1212 and the points where the pixel values are changed.

After the inner border 1201 and the outer border 1202 are found by use of the center position of the entire pattern shape, the position of the reference pattern is determined based on the center position 1203 in the contour distribution (1105). By use of FIG. 26, description will be provided for an example in which the reference pattern is determined according to a rule of using "a point of the L-th pixel from the center position in the contour distribution toward the outer border."

Figure 26A:
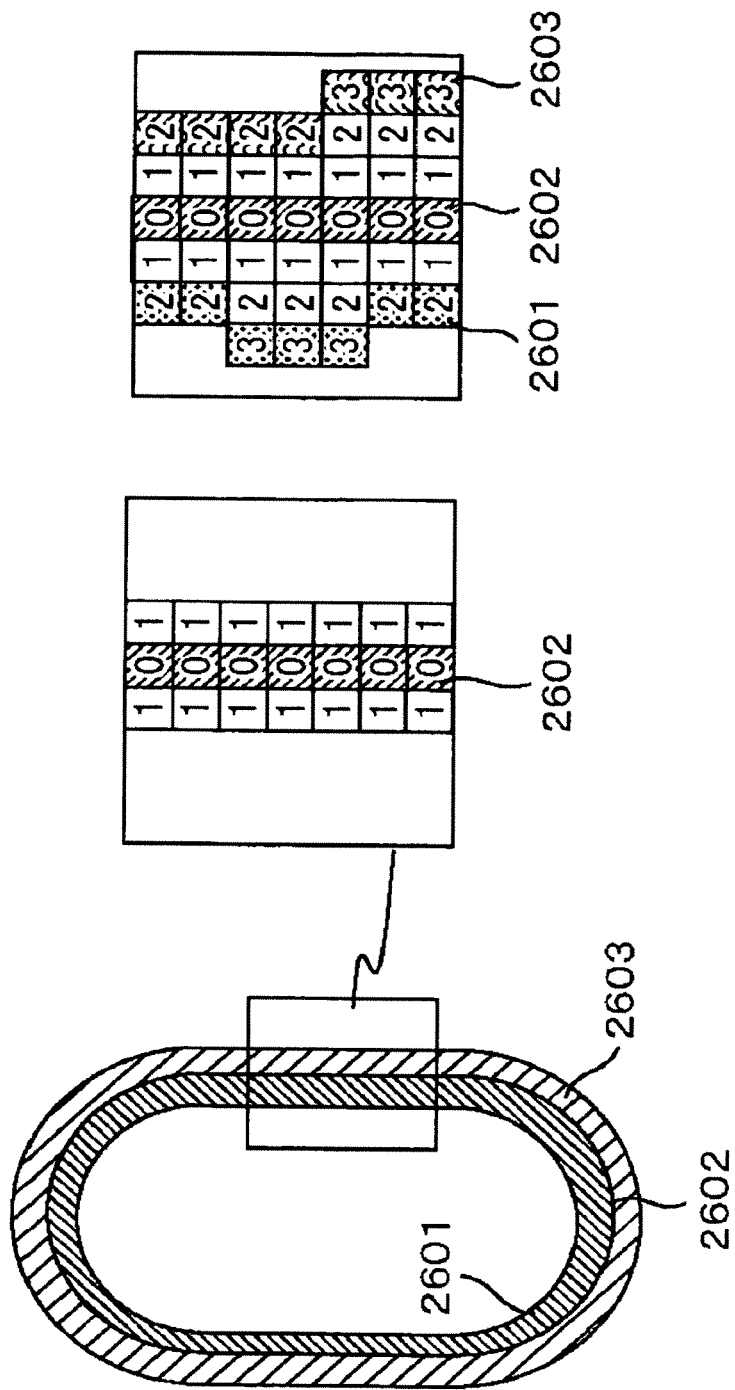
FIGS. 26A and 26B are diagrams showing an example of generating a reference pattern from contour distribution data.
Figure 26B:
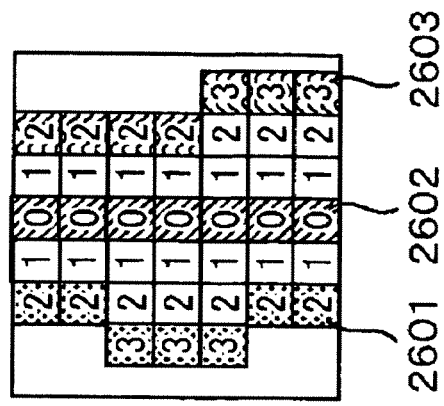

The aforementioned morphology filter (expansion processing) is firstly applied to the pattern of the center position 1203 in the contour distribution. The expansion processing is processing of expanding the pattern width. The pattern of the center position in the contour distribution has a width of one pixel. When this pattern is once processed through the expansion processing, a pattern thus generated has a width of 3 pixels whose center pixel is the pixel of the center position in the contour distribution. FIG. 26 shows an example of this expansion processing. FIG. 26 shows a center pattern 2602 and an inner border 2601 and an outer border 2603 of a contour distribution. When the center pattern 2602 is once processed through the expansion processing, the center pattern 2602 is expanded by one pixel of its either side as shown in an enlarged window in FIG. 26A. The pixels newly added by the expansion processing each exist at a point of a first pixel from the center pattern 2602. Thus, a distance value "1" indicating a distance from the center pattern is written to each of the pixels newly added by the first expansion processing. By iteratively performing the expansion processing and writing the distance value, the distance values can be written to pixels existing between the inner border 2601 and the outer border 2603 of the contour distribution, as shown in an enlarged window FIG. 26B. The point of the L-th pixel from the center toward the outer border in the contour distribution can be easily found by use of the relationship between the thus obtained distance information on the distance from the center, and the inner border 2601 and the outer border 2603 of the contour distribution.

Figure 9:
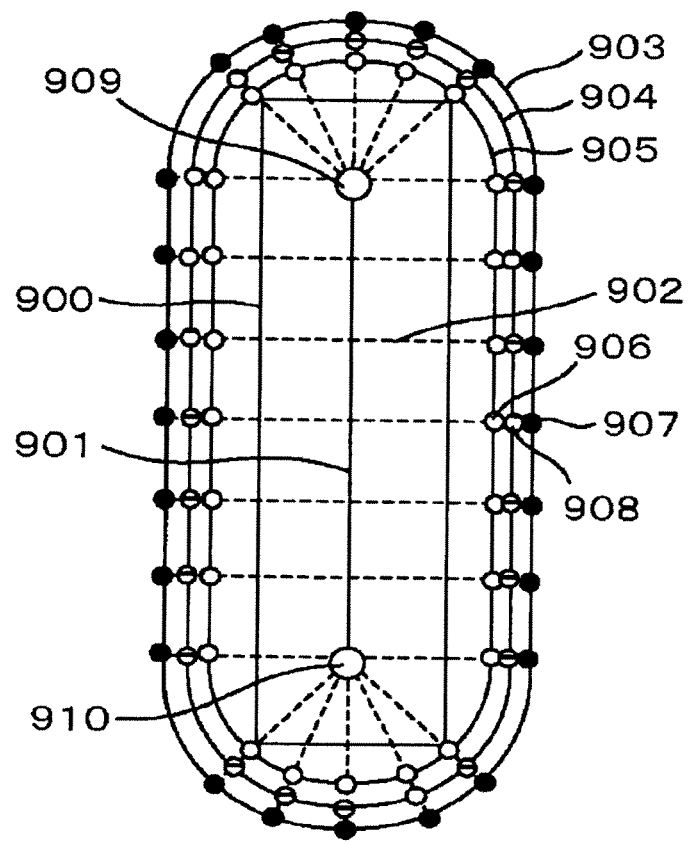
FIG. 9 is a diagram showing a method of generating a reference pattern from contour composite data by using design data as a reference.

In addition, the reference pattern can be formed by use of the center position between contour distribution borders on the basis of the pattern shape of the design data. FIG. 9 is a diagram in which design data 900 is overlaid on an inner border 905 and an outer border 903 of a contour distribution according to the shift amount obtained by the EP matching. Center positions 908 between the contour distribution borders each exist on a straight line (normal line) 902 drawn in a direction of the normal to a center line 901 of the design data 900 (but in a direction extending in a fan-like fashion at both end points 909 and 910 of the center line). More specifically, the center position 908 between the contour distribution borders can be found as the midpoint between an intersection point 906 of the inner border 905 and the straight line (normal line) and an intersection point 907 of the outer border 903 and the straight line (normal line). In the last place, a reference pattern (that is, 904) is formed by finding approximate straight lines and approximate curved lines from the midpoint distribution.

In addition, as shown in FIG. 12E, a user may also be allowed to determine the position of the reference pattern by operating a cursor 1210 through the input means connected to the display 216. In this case, the contour distribution image is displayed on the display 216, and thus the user is allowed to determine the reference pattern while checking the contour distribution image. Note that, the reference pattern thus determined is written to the memory or the like (1106).

Shape Comparison Test

Next, the shape of the reference pattern generated from the contour composite image and the shape of the evaluation target pattern are compared with each other and the shape evaluation value of the evaluation target pattern with respect to the shape of the reference pattern is generated (106). The shape evaluation value is data used to determine whether the below mentioned evaluation target pattern is defective or not.

Figure 13:
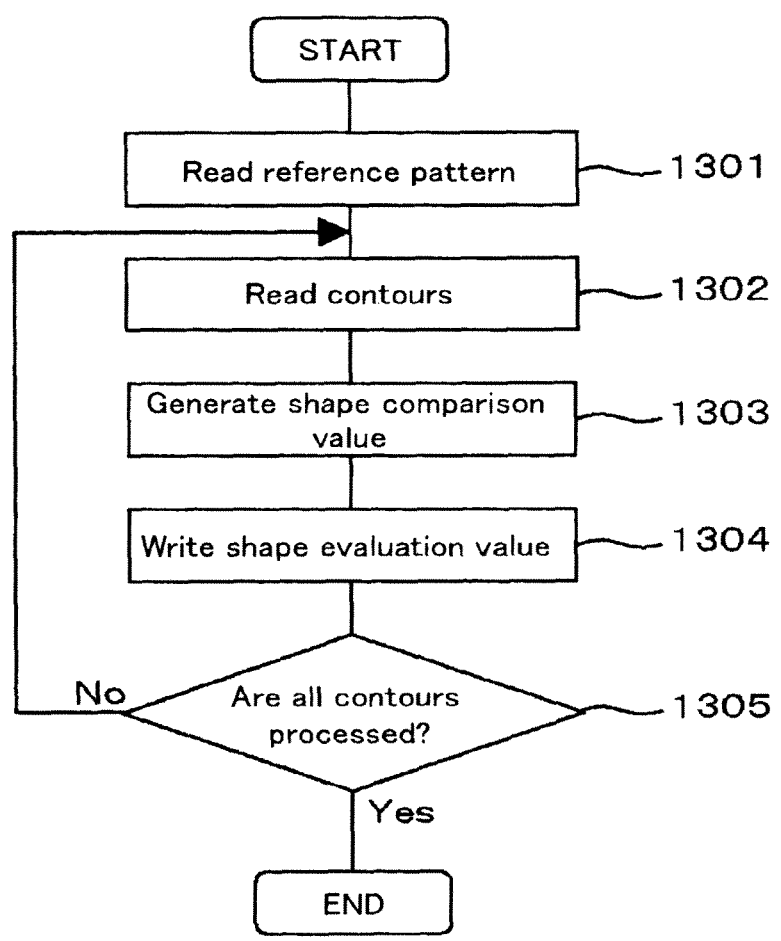
FIG. 13 is a flowchart showing a processing procedure of generating a shape evaluation value of an evaluation target pattern by comparing the shapes of the reference pattern and the evaluation target pattern.

FIG. 13 shows a processing flow. Firstly, the reference pattern is read (1301). Then, the contour data set of the evaluation target pattern is read (1302). After that, the shape evaluation value of the evaluation target pattern with respect to the shape of the reference pattern is obtained by use of the reference pattern in any of methods illustrated below (1303), and the obtained shape evaluation value is written to the memory or the like (1304). These operations are iteratively executed for all the contours (1305). Three methods for generating the shape evaluation value will be described below with use of FIGS. 14A to 14D. However, these methods are not intended to limit the method of generating the shape evaluation value, because any method that allows quality determination of the evaluation pattern is usable (1) Pattern Gap FIG. 14A shows an image in which a reference pattern 1401 and an evaluation target pattern 1402 are overlaid on each other according to the shift amount obtained by the EP matching.

Figure 14A:
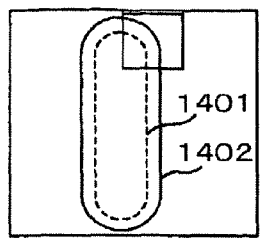
Figure 14B:
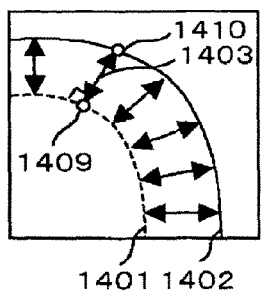

FIG. 14B shows an example in which a gap between the reference pattern 1401 and the evaluation target pattern 1402 having a relationship shown in FIG. 14A is measured and the gap value thus obtained is determined as the shape evaluation value of the evaluation target pattern. The gap measurement can be performed by measuring a gap 1403 between, for example, a point 1409 on the reference pattern, and a point 1410 of the evaluation target pattern existing in a direction normal to the reference pattern at the point 1409. If the gap measurement is performed, for example, on every second pixel on the reference pattern, how much the shape of the evaluation target pattern is deformed from the reference pattern is quantified. Instead, an average or dispersion of pattern gaps may be calculated and used as the shape evaluation value. For example, FIG. 17A shows an example in which a gap L(n) (n: the number of pixels constituting a pattern 1703) between a reference pattern 1702 and the pattern 1703 is measured. In the gap measurement, the gap value is obtained in units of pixels or sub-pixels constituting the pattern 1703. As a result, a large number of gap values L(n) are obtained for a contour data region 1701. For this reason, the shape evaluation value is simplified by calculating the gap average ($\Sigma L(n)/n$)) or the gap dispersion ($\Sigma(L(n)-\Sigma L(n)/n))^2/n$) from the obtained gap values L(n). A pattern 1704 as shown in FIG. 17B has a shape expanded/contracted, as a whole, from the shape of the reference pattern 1702, for example. In this case, the shape evaluation values tend to have a small gap dispersion value and a large gap average value. Instead, a pattern 1705 as shown in FIG. 17C has a shape having a local distortion from the shape of the reference pattern 1702. In this case, the shape evaluation values tend to have a large gap dispersion value. The shape evaluation value thus obtained is written, as table information as shown in FIG. 15A, to the memory or the like.

(2) Shape Deformation Tolerance

Figure 14C:
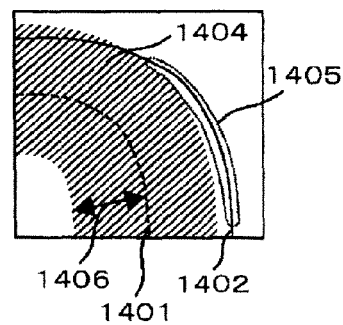

FIG. 14C shows an example in which a band 1404 indicating a tolerance of shape deformation is set in the reference pattern 1401 having the relationship shown in FIG. 14A, and in which a determination result as to whether the evaluation target pattern 1402 is located inside or outside the band is used as the shape evaluation value. For instance, the expansion processing with the aforementioned morphology filter is applied to the reference pattern, and thereby the reference pattern is expanded to cover a tolerable region 1406 of the shape deformation. In this way, the band 1404 indicating the shape deformation tolerance from the reference pattern 1401 can be generated. This band 1404 and the evaluation target pattern 1402 are overlaid on each other according to the shift amount obtained by the EP matching, and a determination is made as to whether each point on the evaluation target pattern 1402 exists inside or outside the band 1404. Here, a portion of the evaluation target pattern 1402 existing outside the band 1404 is referred to as a defective portion 1405. This result is written as the shape evaluation value, i.e., as table information shown in FIG. 15B to the memory or the like.

(3) Pattern Area

FIG. 14D shows a region 1407 surrounded by the reference pattern 1401 and a region 1408 surrounded by the evaluation target pattern 1402. The areas of these regions are figured out by counting the number of pixels surrounded by each of the patterns. An area ratio of the evaluation target pattern 1402 to the reference pattern 1401 is written as the shape evaluation value to the memory or the like.

Quality Determination

Figure 18:
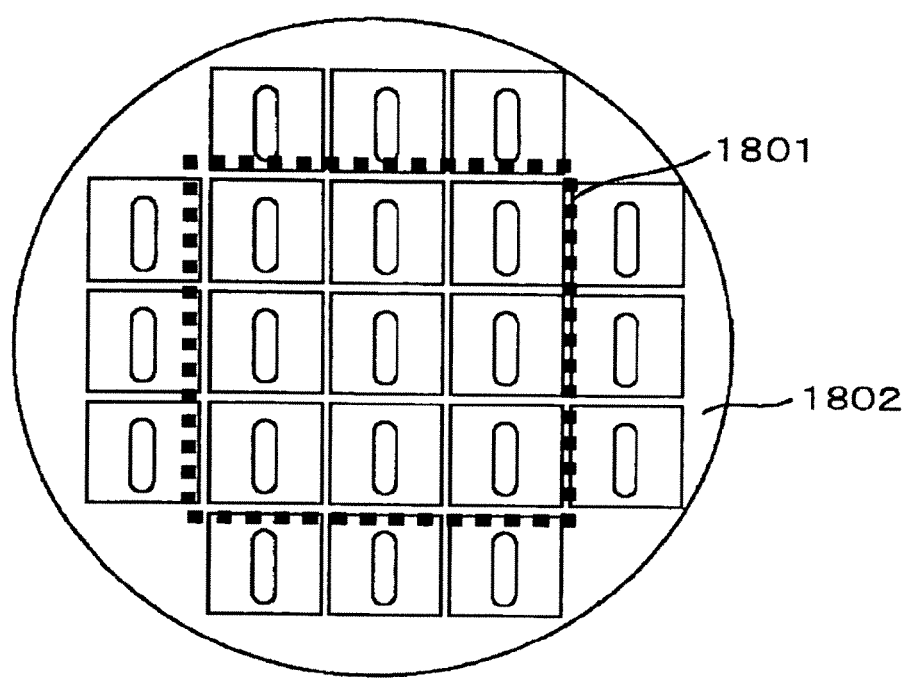
FIG. 18 is a view showing image data providing a result of quality determination to users.

Whether a pattern is defective or not is determined by use of the shape evaluation value obtained as described above (107). FIG. 16 shows a processing flow of this quality determination. In the first place, the shape evaluation value of each of the evaluation target patterns is read (1601). Then, the shape evaluation value is compared with data (a default value) defining information on a non-defective pattern shape, and whether the evaluation target pattern is defective or not is determined (1602). This determination is performed for all the evaluation target patterns (1605), and the evaluation results are lastly written to the memory or the like (108/1606). In addition, in order for the user to easily and distinctively recognize points on a wafer where there are patterns determined as non-defective and patterns determined as defective, a wafer map image is generated as shown in FIG. 18 and displayed on the display. The wafer map image thus generated shows the positions of the patterns on a wafer 1802 and an area 1801 in which non-defective patterns exist. From this wafer map, the user can recognize a point on the wafer where pattern shapes are largely deformed due to process variations.

The method of determining whether or not the shape evaluation value is tolerable depends on the type of the generated shape evaluation value. The following shows the determination methods for the aforementioned shape comparison values (1) to (3).

(1) Pattern Gap

The gap value between an evaluation target pattern and the reference pattern obtained through the shape evaluation is compared with the gap value between a non-defective pattern and the reference pattern obtained in the same manner, a portion of the evaluation target pattern having a gap larger than the corresponding gap of the non-defective pattern is determined as a defective portion, and an evaluation target pattern including a portion determined as defective is determined as defective. In addition, even when the average or dispersion of the pattern gaps is used as the shape evaluation value, the pattern defect is determined through threshold processing in a similar manner.

(2) Shape Deformation Tolerance

When an evaluation target pattern includes a portion that extends outside the shape deformation tolerance of the pattern, the evaluation target pattern is determined as a defective pattern. However, as described above, the contour data set extracted from an image includes noise information, and thereby an incorrect determination may be made due to a contour deformation caused by the noise. For this reason, incorrect detection of defective patterns due to noise included in images is reduced by use of threshold determination in which a pattern is determined as a defective pattern when a portion (defective portion 1405) of the pattern outside the shape deformation tolerance of the pattern is larger than a predetermined value.

(3) Area

An evaluation target pattern in which the area ratio of the region 1407 to the reference pattern is equal to or larger than N, or equal to or smaller than M (where M<N) is determined as a defective pattern.

As has been described above, according to the present invention, a reference pattern used to evaluate the shape of each of circuit patterns in electronic devices is generated from captured images of multiple circuit patterns. This enables the generation of a reference pattern which is suitable for circuit pattern production conditions and which is less influenced by a distortion of each of circuit patterns. Comparing an evaluation target pattern with this reference pattern allows the shape evaluation of the evaluation target pattern to be performed with high accuracy.

Second Embodiment

The foregoing embodiment 1 provides the description of the example in which the overlay position of contour data sets is determined based on a result of matching between the design data and the contour data sets (or images from which contours are extracted).

Instead, the overlaying accuracy can also be improved by detecting a slight shift due to a shape difference between the design data and the evaluation target pattern, a slight shift with rotation of a wafer or the like after the matching of the contour data sets with the design data, and then by making minor adjustment of the overlay position based on the detection result.

Figure 19:
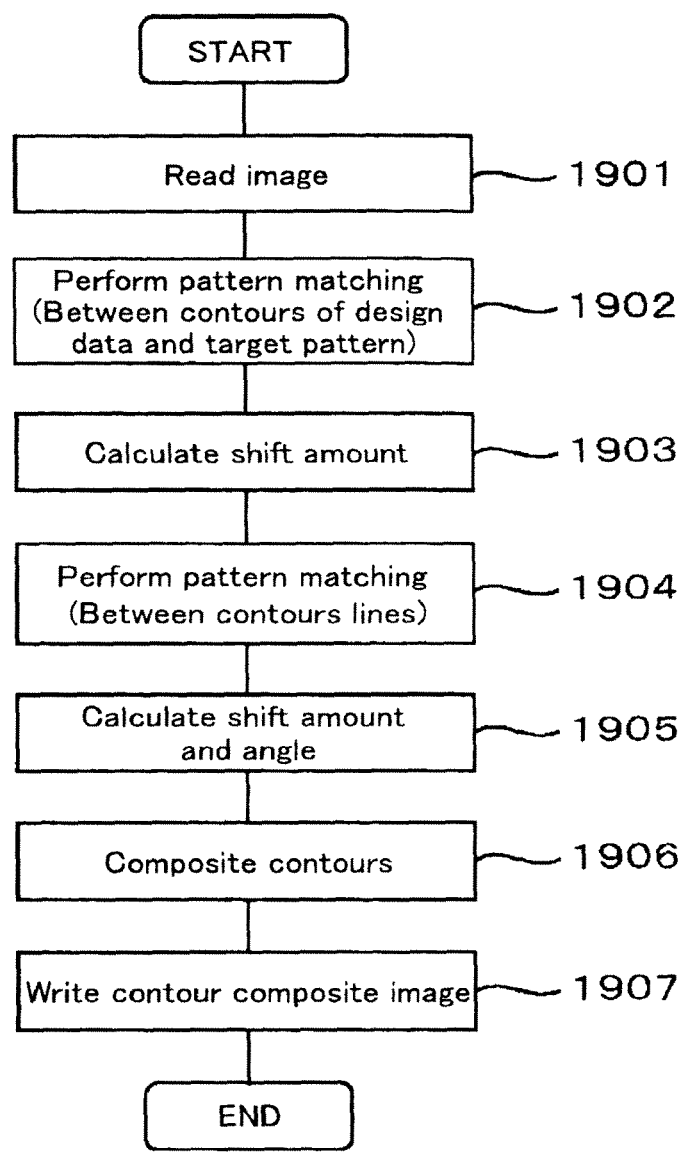
FIG. 19 is a flowchart showing a procedure of overlaying contour data sets on one another with high accuracy.

FIG. 19 shows a processing flow for generating a contour composite image with minor adjustment of the overlay position by use of contour data sets.

Figure 20A:
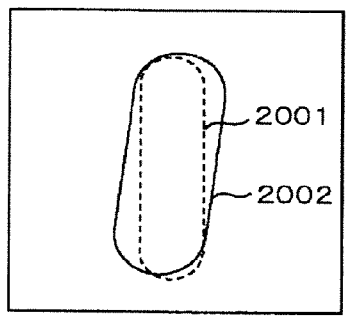
FIGS. 20A and 20B are views showing a rotation and shift of a contour data set and its correction result.

Firstly, as described in Embodiment 1, each of the contour data sets is read (1901), the matching of the design data and the evaluation target pattern is performed (1902), and thereby the shift amount is calculated (1903). FIG. 20A shows an example of two contour data sets overlaid based on the shift amounts thus calculated. Although this is an extreme example, a contour data set 2002 is inclined from a contour data set 2001. In order to detect a rotation or a slight shift of a contour data set from another one, matching between the contour data sets is performed (1904), and thereby a position correction amount is calculated (1905).

Figure 20B:
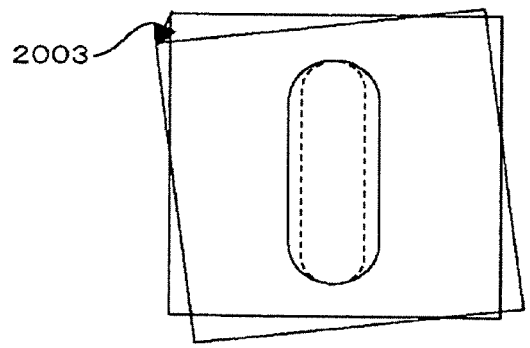

Specifically, one of the contour data sets of the evaluation target pattern, for example, the contour data set 2001, is used as a template, and the matching of the other evaluation target pattern, i.e. the contour data set 2002 with the contour data set 2001 is performed. With this matching, a position correction amount (a rotation angle and a positional shift amount) 2003 is calculated as shown in FIG. 20B.

A method applicable to the pattern matching is one capable of finding a matching point accurately even when the template and the evaluation target pattern are different in size (in terms of the pattern shape deformation due to process variations, it is often the case that a pattern is simply expanded or contracted while keeping its original pattern shape, except for certain shape anomaly) or even when the evaluation target pattern is rotated from the template. One example of such method is the generalized Hough transform described on p. 215 of "dejitaru gazo shori (digital image processing) published by Computer Graphic Arts Society (CG-ARTS)." However, it should not be understood that the method is limited to this, because various matching methods well functioning even under the presence of a rotation angle between patterns and pattern deformation have been proposed besides the generalized Hough transform. Then, finally, according to the position correction amount 2003 of the evaluation target pattern detected through the matching between the contour data sets, the rotational adjustment is made on the evaluation target pattern, and the contour data sets are overlaid on each other at a point corresponding to the overlay position.

As described above, in the present invention, before the contour data sets are actually overlaid on each other, the matching between contour data sets is performed using one of the contour data sets as a template while allowing for a shape difference and rotation of one contour data set from another set. Through this matching, the position correction amount 2003 of the contour data set is calculated, and the position of the contour data set is corrected based on the position correction amount 2003. Thereby, the contour data sets are overlaid on each other with high accuracy (1906), and a more accurate reference pattern for the pattern shape evaluation is generated (1907). Use of this reference pattern for comparison of an evaluation target pattern leads to more accurate shape evaluation of patterns.

Third Embodiment

Hereinafter, description will be provided for another embodiment for measuring a process window.

The shape evaluation methods in Embodiments 1 and 2 have been described as the case where the multiple patterns for the reference pattern generation are prepared separately from the evaluation target pattern. Instead of this, the reference pattern may be generated from multiple evaluation target patterns, and the shapes of the evaluation target patterns are each evaluated by use of the reference pattern thus generated. In this way, the shape of each evaluation target pattern can be evaluated relative to shape variation of the evaluation target patterns, that is, the shape of each evaluation target pattern can be evaluative in terms of a difference from an average shape of the evaluation target patterns.

For example, multiple patterns having the same shape on the design data and being formed on different chips are imaged; the contour data sets are extracted from a captured image of each chip; and the contour distribution data is generated. This contour distribution shows variation in pattern shape among the chips, the variation caused by process variations. Thereafter, an average position of the contour distribution is used to form the reference pattern. This reference pattern shows an average point of the pattern shapes which varies among the chips due to the process variations. By measuring the gap between this reference pattern and each of the evaluation target patterns as described in Embodiment 1, an evaluation can be made as to how much the evaluation target pattern deviates from the average point in the pattern shape variation caused by the process variations.

Moreover, whether a pattern is defective or not is determined by comparing this deviation range and the tolerance for pattern shape deformation as shown in Embodiment 1. This quality determination is performed for all the evaluation target patterns.

According to the present invention, by using the reference pattern generated from multiple evaluation target patterns for the shape evaluation of each of the evaluation target patterns, the evaluation target patterns can be evaluated relative to shape variation among the evaluation target patterns.

Fourth Embodiment

When a reference pattern is generated by use of multiple pattern images with relatively small pattern shape deformation due to process variations, the reference pattern thus generated is free from small edge deformation that may be otherwise caused by edge roughness and noise. In recent process techniques, contour data on patterns formed on a wafer has been increasingly used for calibration in an optical proximity correction (OPC) model. In the formation of the OPC model, an importance is particularly placed on elimination of pattern deformation due to noise included in images. For this reason, for the calibration, it is effective to use a reference pattern generated from multiple patterns affected by process variations only to a small extent.

Figure 27:
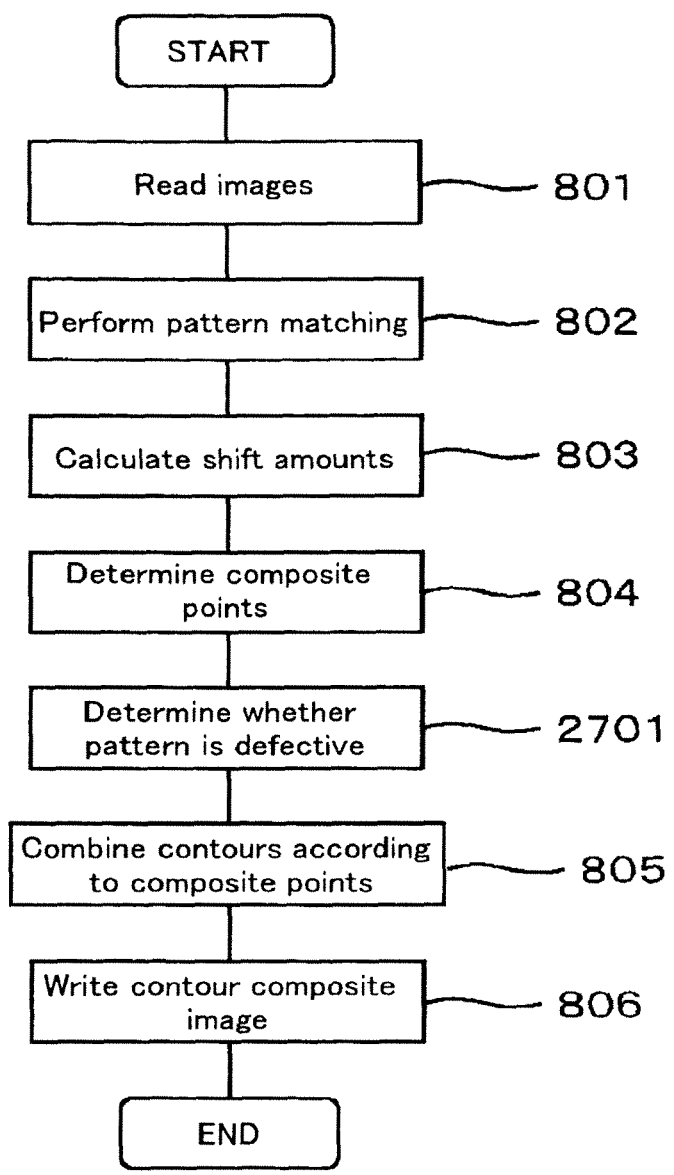
FIG. 27 is a flowchart showing a procedure of generating contour composite data with a largely-deformed pattern excluded from patterns to be used for a contour composite.

For this purpose, the method of forming a contour composite and the method of evaluating the shape by using the generated reference pattern according to the foregoing embodiments are usable. The purpose of this embodiment, however, is to detect and generate the reference pattern from patterns with only small pattern shape deformation due to process variations. It should be noted, here, that the shape of a reference pattern may be also largely deformed if the reference pattern is generated from patterns with large shape deformation. In a procedure of forming a composite of contour data sets as shown in FIG. 27, a determination is made as to whether each of patterns is a non-defective pattern or a defective pattern (2701), and then only the non-defective patterns are processed to form a contour composite. This processing enables the generation of a reference pattern free from both small edge deformation due to edge roughness and noise, and large deformation due to the process variations and the like. Specifically, the gap between a pattern and design data, for example, the gap between each of representative points in a pattern and that of the design data is measured, and then the measured value is compared with a gap value (default value) tolerable for a non-defective pattern.

As has been described, in the present invention, the processing of: detecting a contour data set of a largely-deformed pattern through the pattern shape evaluation; and generating the contour composite from the contour data sets excluding the detected contour data set are additionally performed prior to the generation of a contour composite described in Embodiments 1 to 3. Thus, the present invention enables the generation of a reference pattern suitable for OPC model calibration and pattern shape evaluation.

It should be noted that the technique of the present invention is widely applicable to apparatuses with which the shapes of circuit patterns of electronic devices manufactured by use of a wafer, reticle and the like are evaluated based on the captured images of the circuit patterns.

What is claimed is:

1. A pattern generating apparatus that generates a reference pattern used to evaluate a shape of a circuit pattern of an electronic device, the pattern generating apparatus comprising:

reference pattern generating means for generating, from contour data sets of at least two circuit patterns, a reference pattern used in a pattern test, wherein the reference pattern generating means determines points that cross the at least two contour data sets and, in a direction applied to each portion of the patterns, respectively correspond to contour data of one circuit pattern and to contour data of another circuit pattern, and generates the reference pattern based on extraction of an average position between the corresponding point of the contour data of the one circuit pattern and the corresponding point of the contour data of the other circuit pattern, or a center position between the corresponding point of the contour data of the one circuit pattern and the corresponding point of the contour data of the other circuit pattern.

2. A pattern generating apparatus that generates a reference pattern used to evaluate a shape of a circuit pattern of an electronic device, the pattern generating apparatus comprising:

reference pattern generating means for generating, from contour data sets of at least two circuit patterns, a reference pattern used in a pattern test, wherein the reference pattern generating means executes contour filling processing for a region interposed between the at least two contour data sets, and generates the reference pattern based on thinning processing performed on the filled region.

3. The pattern generating apparatus according to claim 1 or 2, further comprising:

means for identifying a position for overlaying the contour data sets on one another by performing pattern matching between one contour data and another contour data; and contour distribution data generating means for generating contour distribution data based on the identified position for overlaying the contour data sets on one another.

4. The pattern generating apparatus according to claim 1 or 2, further comprising:

means for identifying a position for overlaying the contour data sets on one another by performing pattern matching between design data and each of the contour data sets; and contour distribution data generating means for generating contour distribution data based on the position for overlaying the design data and each of the contour data sets.

5. The pattern generating apparatus according to claim 1 or 2, further comprising:

contour distribution data generating means for comparing a default value of the shape of the circuit pattern with a shape of each of the contour data sets, and generating the contour distribution data only by using contour data that satisfies the default value of the shape of the circuit pattern.

6. The pattern generating apparatus according to claim 1 or 2, wherein the reference pattern generating means identifies a distribution of contours from the at least two contour data sets, and sets the reference pattern within a range of the distribution of contours.

7. The pattern generating apparatus according to claim 1 or 2, wherein the reference pattern generating means generates the reference pattern from the at least two contour data sets in reference to the shape of the design data of the circuit pattern.

8. A pattern shape evaluating apparatus, comprising:

the means for generating contour data to be overlaid according to claim 1 or 2;

reference pattern generating means; and shape evaluation means for generating a shape evaluation value of an evaluation target pattern with respect to the reference pattern by comparing the reference pattern with the evaluation target pattern.

9. The pattern shape evaluating apparatus according to claim 8, wherein the shape evaluation means includes quality determination means for determining whether the evaluation target pattern is defective or not, by using the shape evaluation value.

10. The pattern shape evaluating apparatus according to claim 8, wherein:

as the shape evaluation value of the evaluation target pattern, a gap between the reference pattern and the evaluation target pattern is measured, one of an average of gaps, a dispersion of the gaps, or an area ratio of the evaluation target pattern to the reference pattern is calculated, or whether the evaluation target pattern exists outside or inside a pattern shape deformation tolerance provided to the reference pattern is determined, and the pattern shape evaluating apparatus further comprises quality determination means for determining whether the evaluation target pattern is defective or not, by comparing the shape evaluation value with a default value for determining whether the evaluation target pattern is defective or not.

11. A pattern shape evaluating apparatus, comprising:

the means for generating contour data to be overlaid, the reference pattern generating means according to claim 1 or 2;

shape evaluation means for generating a shape evaluation value of an evaluation target pattern with respect to the reference pattern by comparing the reference pattern with the evaluation target pattern, a quality determination means for determining whether the evaluation target pattern is defective or not;

imaging means for obtaining a captured image of an evaluation target pattern and captured images of at least two circuit patterns for generating a reference pattern;

means for extracting contour data sets of the circuit patterns from the captured images; and data storage means for storing the captured images, the contour data sets, the at least two contour data sets, the reference pattern, the shape evaluation value, and data on the quality determination result which are obtained by the pattern shape evaluation.

12. The pattern shape evaluating apparatus according to claim 11, further comprising: means for generating, from design data of the circuit patterns, a recipe for obtaining a captured image of each of the circuit patterns by the imaging means.

13. The pattern shape evaluating apparatus according to claim 11, further comprising:

a data display means for displaying the at least two contour data sets, the reference pattern, and the data on the shape evaluation result.

14. The pattern shape evaluating apparatus according to claim 11, further comprising:

data input means for reflecting instructions from a user into the reference pattern generating means, the shape evaluation means, and the quality determination means, wherein the reference pattern generating means, the shape evaluation means, and the quality determination means generate the reference pattern and perform the shape evaluation on the basis of instruction data from the data input means.

15. The pattern generating apparatus according to claim 1 or 2, further comprising: data input means for reflecting instructions from a user into the reference pattern generating means, wherein the reference pattern generating means generates the reference pattern on the basis of instruction data from the data input means.

16. The pattern shape evaluating apparatus according to claim 13, wherein an image of a wafer map is generated, the wafer map indicating the shape evaluation value and the quality determination result, and the image of the wafer map is displayed on the data display means.

* * * * *